United States Patent
Xie et al.

(10) Patent No.: US 10,068,804 B2
(45) Date of Patent: Sep. 4, 2018

(54) METHODS, APPARATUS AND SYSTEM FOR PROVIDING ADJUSTABLE FIN HEIGHT FOR A FINFET DEVICE

(71) Applicant: GLOBALFOUNDRIES INC., Grand Cayman (KY)

(72) Inventors: Ruilong Xie, Niskayuna, NY (US); Peng Xu, Guilderland, NY (US); Chun Wing Yeung, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 37 days.

(21) Appl. No.: 15/423,326

(22) Filed: Feb. 2, 2017

(65) Prior Publication Data

US 2018/0218947 A1    Aug. 2, 2018

(51) Int. Cl.
| | | |
|---|---|---|
| H01L 21/00 | (2006.01) | |
| H01L 21/8234 | (2006.01) | |
| H01L 21/311 | (2006.01) | |
| H01L 21/28 | (2006.01) | |
| H01L 21/02 | (2006.01) | |
| H01L 29/66 | (2006.01) | |
| H01L 21/321 | (2006.01) | |
| H01L 29/08 | (2006.01) | |
| H01L 29/417 | (2006.01) | |
| H01L 21/66 | (2006.01) | |

(52) U.S. Cl.
CPC .. *H01L 21/823431* (2013.01); *H01L 21/0228* (2013.01); *H01L 21/02164* (2013.01); *H01L 21/28194* (2013.01); *H01L 21/31111* (2013.01); *H01L 21/3212* (2013.01); *H01L 21/823418* (2013.01); *H01L 21/823437* (2013.01); *H01L 21/823462* (2013.01); *H01L 21/823481* (2013.01); *H01L 22/20* (2013.01); *H01L 29/0847* (2013.01); *H01L 29/41783* (2013.01); *H01L 29/66545* (2013.01)

(58) Field of Classification Search
CPC ....... H01L 21/823431; H01L 21/31111; H01L 21/823418; H01L 21/823462; H01L 21/28194; H01L 21/0228
See application file for complete search history.

(56) References Cited

U.S. PATENT DOCUMENTS

| | | | |
|---|---|---|---|
| 9,318,343 B2 * | 4/2016 | Ranjan | H01L 21/31116 |
| 9,391,200 B2 * | 7/2016 | Liu | H01L 29/7848 |
| 9,508,848 B1 * | 11/2016 | Akarvardar | H01L 29/66795 |

\* cited by examiner

*Primary Examiner* — Richard Booth
(74) *Attorney, Agent, or Firm* — Williams Morgan, P.C.

(57) ABSTRACT

A method and system are disclosed herein for an adjustable effective fin height in a gate region of a finFET device. Fin structures, each having a first height, a fin, an oxide liner, and a nitride liner, are formed. A first portion of the nitride liner is removed. A first portion of the oxide liner is removed. A second portion of the nitride liner in a gate portion of the finFET. Source/drain(s) are formed, and a nitride spacer between the source/drain and the gate portion is formed. A second portion of the oxide liner is exposed by removing the second portion of the nitride liner, exposing a second portion of the fin, wherein the first and second exposed portions of the fin being an effective fin height in the gate portion.

20 Claims, 13 Drawing Sheets

METHODS, APPARATUS AND SYSTEM FOR PROVIDING ADJUSTABLE FIN HEIGHT FOR A FINFET DEVICE

BACKGROUND OF THE INVENTION

Field of the Invention

Generally, the present disclosure relates to the manufacture of sophisticated semiconductor devices, and, more specifically, to various methods for providing adjustable effective fin height for fins in a gate region of a finFET device.

Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide semiconductor field effect transistors (MOSFETs or FETs) represent one significant type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by a voltage applied to the gate electrode. If a voltage that is less than the threshold voltage of the device is applied to the gate electrode, then there is substantially no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

In contrast to a planar FET, which has a flat structure, there are so-called 3D devices, such as a FinFET device, which is a 3-dimensional structure. More specifically, in a FinFET, a generally vertically positioned, fin-shaped active area is formed and a gate electrode encloses both of the sides and the upper surface of the fin-shaped active area to produce a channel having a 3-dimensional structure instead of a planar structure. In some cases, an insulating cap layer, e.g., silicon nitride is positioned at the top of the fin-shaped active areas.

FinFET designs use "fins" that may be formed on the surface of a semiconductor wafer using selective-etching processes. The fins may be used to form a raised channel between the source and drain of a transistor. The gate is then deposited such that it wraps around the fin. This 3-dimensional channel is relatively thin, and thus, the gate generally has significant control over the carriers within. However, the shape of the channel may limit the current flow. Therefore, multiple fins may be used in parallel to provide greater current flow for increased drive strength.

Another state of the art solution offered by designers includes growing an epitaxial (EPI) feature at the top of source/drain fins of finFETs. To increase the drive strength of the finFETs, EPI features are formed on the fins. However, the processes used to form these EPI features can cause height irregularities between fins at source/drain (S/D) regions versus fins inside the gate region. For example, the effective fin height at the S/D regions may be enlarged by certain processes, such as spacer reactive ion etching (RIE) processes and EPI pre-clean processes, causing an appreciable effective height difference between fins at the S/D region and fins at the gate regions. This may cause various problems, such as current leakage.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods, apparatus and system for fabricating a fin field effect transistor (finFET) device having adjustable effective fin height in a gate region of the finFET device. At least one method, apparatus and system disclosed herein for fabricating a fin field effect transistor (finFET) device having an adjustable effective fin height in a gate region of the finFET device. At least one method, apparatus and system disclosed herein for fabricating a fin field effect transistor (finFET) device having an adjustable effective fin height in a gate region of the finFET device. A set of fin structures is formed. Each of the fin structures has a first height and comprising a fin, an oxide liner, and a nitride liner. A first partial nitride liner removal process is performed for removing a first portion of the nitride liner above a second height. The said second height is below said first height. A partial oxide liner removal process is performed for removing a first portion of said oxide liner above said second height to expose a first portion of the fin. A second partial nitride liner removal process is performed for removing a second portion of said nitride liner between said second height and a third height in a gate portion of said set of fin structures. The third height is below said second height. Source/drain are formed, and a nitride spacer between said source/drain and said gate portion is formed. A second portion of said oxide liner exposed by removing said second portion of said nitride liner is removed to expose a second portion of the fin, wherein the first and second exposed portions of the fin being an effective fin height in said gate portion.

BRIEF DESCRIPTION OF THE DRAWINGS

The disclosure may be understood by reference to the following description taken in conjunction with the accompanying drawings, in which like reference numerals identify like elements, and in which.

Figure 1:
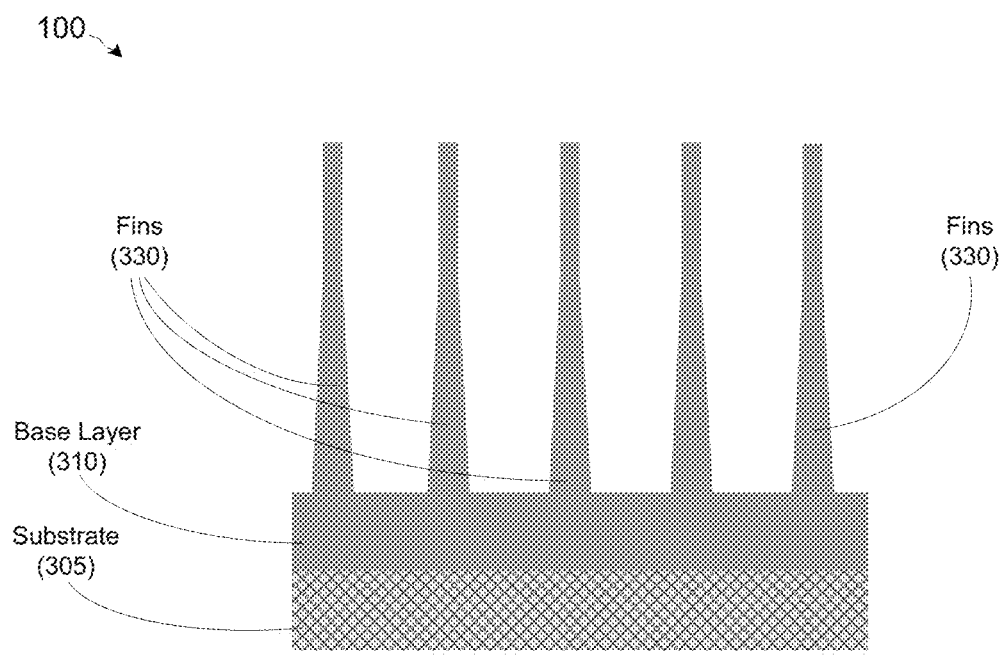
FIG. 1 illustrates a stylized cross-sectional view of a set of finFETs under manufacture, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for forming finFET devices that comprise fins in source/drain (S/D) regions that have substantially similar depth/height as fins in the gate regions. When forming fins in the finFET device, embodiments herein provide for performing a process for intentionally recessing a nitride liner from the fins prior to forming dummy gate regions.

For example, after oxide liners and nitride liners are formed on a plurality of fins, a hot phosphorus nitride liner removal process may be performed to selective remove a portion of the nitride liner. Subsequently, upon removing a portion of the oxide liner, a divot between the fins may be created using an additional hot phosphorus or Frontier™ nitride liner etch-back process.

When processing semiconductor wafers for forming finFET devices, the effective height of fins in the gate regions may be smaller relative to the effective height of the fins in the S/D regions. For example, initial formation of fins results in effective fin height in the S/D regions that are essentially the same as the effective fin height in the gate regions. However, further in the process of forming finFET devices, due to processes that are specific to S/D regions (e.g., epitaxial growth process), the effective fin height in S/D regions may increase relative to the effective fin height in gate regions. The effective fin height in the S/D regions may increase relative to gate regions due to process factors such as spacer RIE, EPI pre-clean process, etc. Therefore, the effective fin height in the gate regions may become smaller relative to the increased effective fin height in the S/D region. Embodiments herein provide for performing an additional nitride liner etch-back process and creating divots prior to performing dummy gate deposition process, thereby providing the ability to later increase the effective height of the gate region. This increase in the effective height of the gate region may be performed without harming nitride spacers that provide isolation between the S/D and gate regions since there is no need to perform a nitride etch process in order to increase the effective fin height of the gate region. Accordingly, embodiments herein provide for reducing the differences between the effective fin height of the S/D region that was increased as a result of certain S/D region processes, and the effective fin height in the gate regions, which did not experience an increase in effective fin height.

Since embodiments herein provide for recessing the nitride liners prior to forming dummy gate regions, oxide liners of the fins in the gate regions may be recessed while avoiding the need for additional nitride recessing processes, thereby preserving nitride spacers between S/D and gate regions. The process described herein provides for increasing the effective fin height of the gate regions without excessively damaging existing nitride spacers, thereby further preserving isolation between the gate regions and S/D contact formations. The process described herein provides for forming fins in S/D regions and fins in gate regions that have substantially uniform height/depths. As a result of implementing embodiments herein, current leakage, which could otherwise occur if the S/D fins and gate fins did not have substantially uniform heights/depths, may be reduced.

FIGS. 1-21 illustrate stylized cross-sectional depictions of finFET devices under various stage of manufacture, in accordance with embodiments herein. FIG. 1 illustrates a stylized cross-sectional view of a set of finFETs (device 100) under manufacture, in accordance with embodiments herein. In some embodiments, initial finFET processing steps known to those skilled in the art having benefit of the present disclosure may be performed to provide a finFET device 100 under manufacture that comprises a plurality of fins. The device 100 comprises a substrate layer 305 (e.g., silicon substrate, silicon germanium substrate, etc.) on which a base layer 310 is formed. In some embodiments, the substrate layer 305 and the base layer 310 may be a single layer. Using one of various techniques known to those skilled in the art, a plurality of fins 330 are formed on the base layer 310. In some embodiments, each of the fins 330 may be part of a fin structure, which may include a fin 330 and a plurality of layers of materials that may be deposited on the fins 330.

Figure 2:
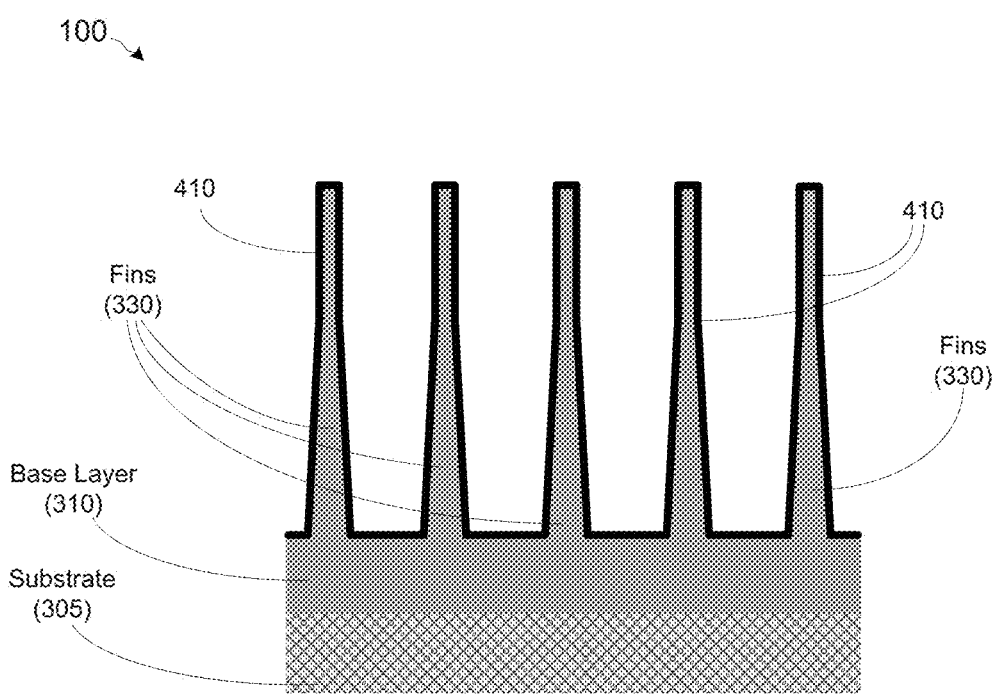
FIG. 2 illustrates a stylized cross-sectional depiction of the finFET device under manufacture with respect to an oxide deposition process, in accordance with embodiments herein.

Turning now to FIG. 2, a stylized cross-sectional depiction of the finFET device under manufacture with respect to an oxide deposition process is illustrated, in accordance with embodiments herein. An oxide liner deposition process is performed. This process comprises deposition of a silicon oxide liner 410 over the fins 330, including within spaces between the fins 330. The oxide material is deposited between the small spaces between the fins 330. The deposition of the oxide material produces an oxide layer 410 over the fins 330. In one embodiment, the oxide deposition process may be performed using an in-situ steam generated (ISSG) oxide deposition process. Further, the oxide material 410 deposited above the fins 330 may be thin enough to leave a space between the fins 330.

Figure 3:
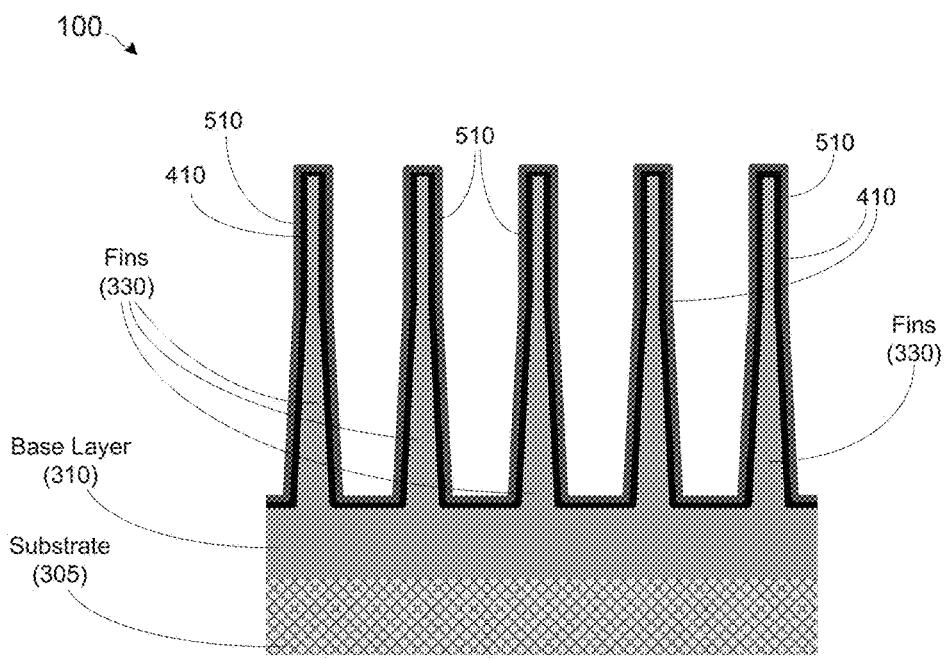
FIG. 3 illustrates a stylized cross-sectional depiction of the finFET device under manufacture with respect to a nitride deposition process, in accordance with embodiments herein.

FIG. 3 illustrates a stylized cross-sectional depiction of the finFET device 100 under manufacture with respect to a nitride deposition process, in accordance with embodiments herein. A silicon nitride deposition process may be performed. The deposition of silicon nitride material provides a nitride liner 510 shown in FIG. 3. In one embodiment, the nitride liner 510 may be provided by performing an in-situ radical assisted deposition (iRAD) process. The nitride liner 510 may act to reduce or even prevent oxidization of the fins 330. The deposition of the nitride liner 510 over the oxide liner 410 on the fins 330 results in fin structures that each comprise a fin 330, an oxide liner 410, and a nitride liner 510.

Figure 4:
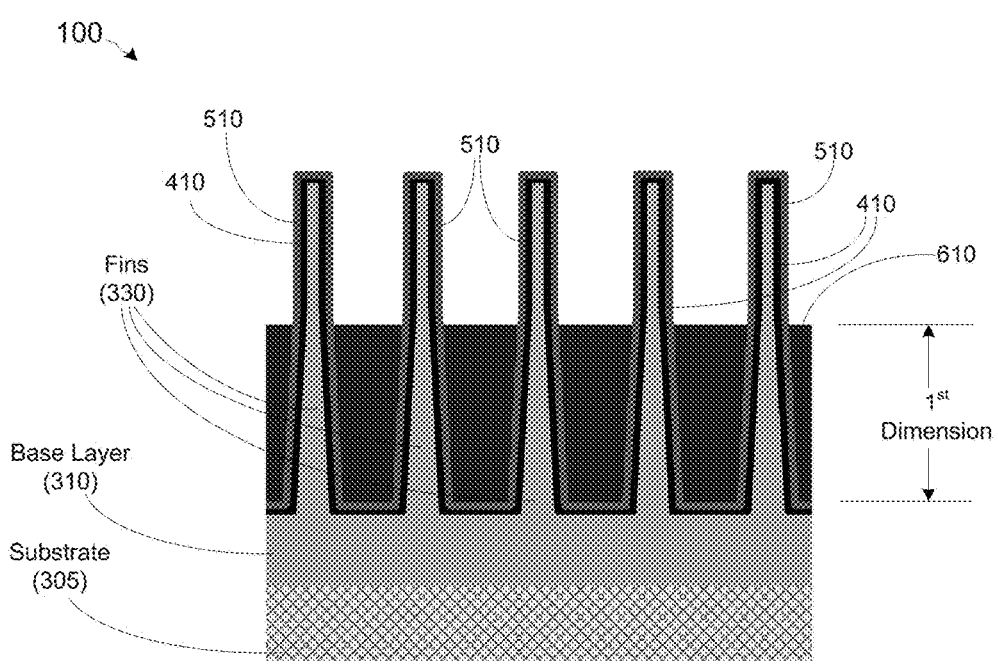
FIG. 4 illustrates a stylized cross-sectional depiction of the finFET device under manufacture with respect to a local isolation oxide region and fin reveal process, in accordance with embodiments herein.

FIG. 4 illustrates a stylized cross-sectional depiction of the finFET device under manufacture with respect to a fin reveal process, in accordance with embodiments herein. As part of a fin reveal process, a local isolation oxide region 610 comprising, e.g., a flow oxide material (e.g., $SiO_2$) may be formed. The local isolation oxide region 610 is formed up to a height above the fin structures and then planarized. The local isolation oxide region 610 may then be recessed or etched down to a predetermined height (i.e., $1^{st}$ dimension) for revealing a portion of the fin structures containing fins 330. This etching process may include one or more etch processes (e.g., a fin reveal etch process).

Figure 5:
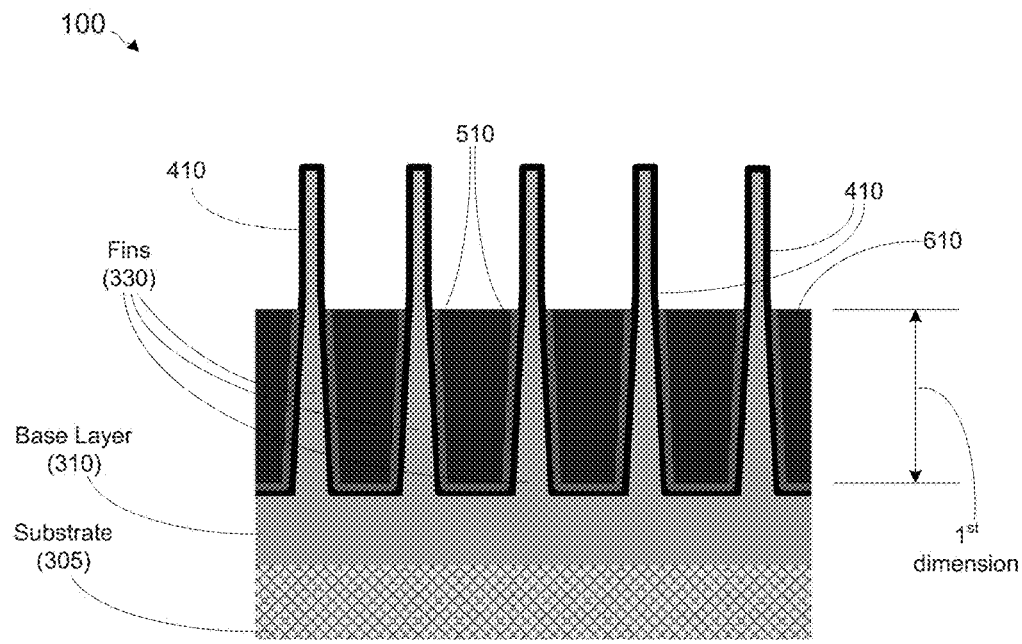
FIG. 5 illustrates a stylized cross-sectional depiction of the finFET device under manufacture with respect to a nitride removal process, in accordance with embodiments herein.

FIG. 5 illustrates a stylized cross-sectional depiction of the finFET device 100 under manufacture with respect to a nitride removal process, in accordance with embodiments herein. A nitride removal process is performed on the device 100. This process removes the portion of the nitride liner 510 that is exposed, i.e., the portion above the recessed local isolation oxide region 610.

In one embodiment, a first hot phosphorus nitride liner removal process may be performed to remove the nitride liner 510 exposed above the local isolation oxide region 610. The removal of the nitride liner above the local isolation oxide region 610 leaves the oxide liner 410 remaining over the fins 330. Further, the portion of the nitride liner 510 below the height (i.e., the $1^{st}$ dimension) of the local isolation oxide region 610 still remains, as shown in FIG. 5.

Figure 6:
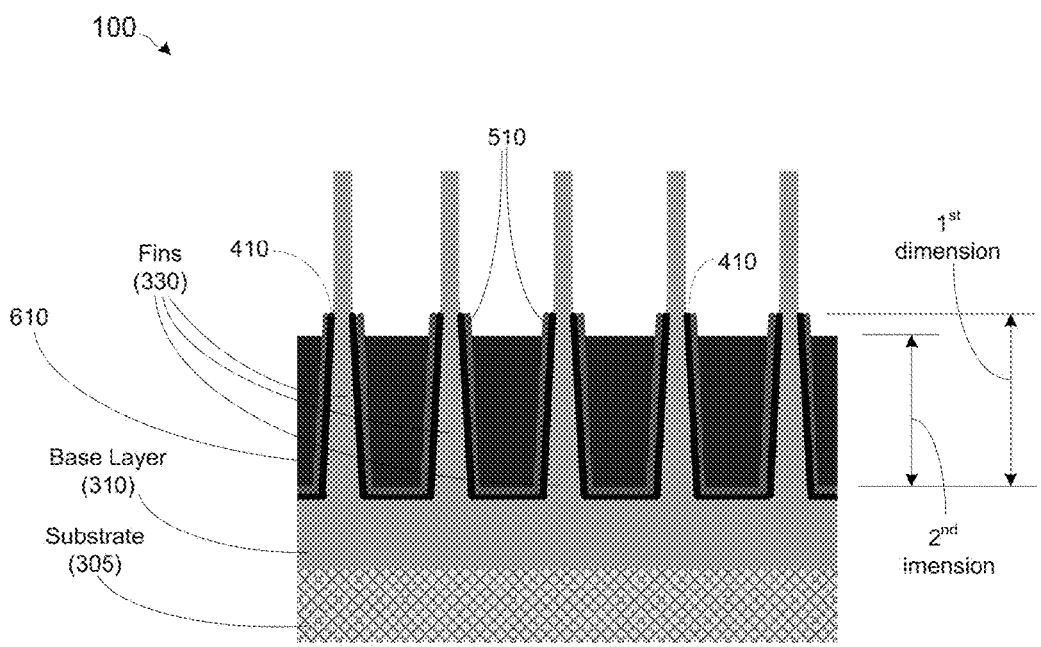
FIG. 6 illustrates a stylized cross-sectional depiction of the finFET device under manufacture with respect to an oxide liner removal process, in accordance with embodiments herein.

FIG. 6 illustrates a stylized cross-sectional depiction of the finFET device 100 under manufacture with respect to an oxide liner removal process, in accordance with embodiments herein. An oxide liner removal process is performed. This process removes a portion of the oxide liner 410 that is exposed above the $1^{st}$ dimension. That is, the oxide liner 410 is removed down to the previous removal-level of the nitride liner 510 (FIG. 5).

Moreover, the oxide liner removal process (FIG. 6) also removes a portion of the local isolation oxide region 610 to lower its height to slightly below the height of the original local isolation oxide region 610 of FIG. 5 (i.e., from the $1^{st}$ dimension down to a $2^{nd}$ dimension). The value of the $2^{nd}$ dimension (FIG. 6) is smaller than the value of the $1^{st}$ dimension (FIG. 5) by a predetermined amount, e.g., an amount related to the parameters of the oxide liner removal process. This process exposes a portion of the remaining nitride liner 510 down to the $2^{nd}$ dimension, as shown in FIG. 6.

Figure 7:
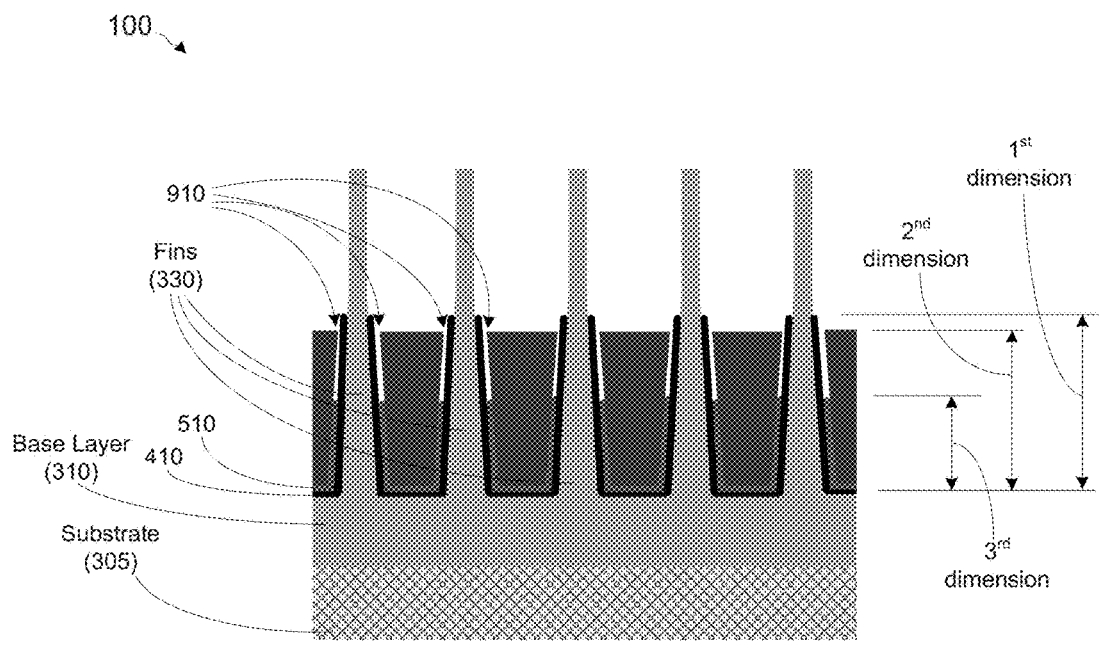
FIG. 7 illustrates a stylized cross-sectional depiction of the finFET device under manufacture with respect to a second nitride removal process, in accordance with embodiments herein.

FIG. 7 illustrates a stylized cross-sectional depiction of the finFET device 100 under manufacture with respect to a second nitride removal process, in accordance with embodiments herein. A second nitride removal process is performed on the device 100 to etch-back a further portion of the nitride liner 510. This process removes the portion of the nitride liner 510 that is exposed, i.e., the portion above the local isolation oxide region 610 that was removed down to the $2^{nd}$ dimension, and further below. That is, another portion of the nitride liner 510 is removed, down to the $2^{nd}$ dimension, and then further down to a $3^{rd}$ dimension.

In one embodiment, a second hot phosphorus nitride liner etch-back process may be performed to remove the portion of the nitride liner 510 that was exposed above the local isolation oxide region 610 and the portion that extends between the $2^{nd}$ and $3^{rd}$ dimensions. In an alternative embodiment, a selective isotropic dry etch process may be used to perform this nitride liner etch-back process.

The nitride liner etch-back process removes a portion of the nitride liner 510 but leaves the oxide liner 410 on the side of the fins 330 below the $1^{st}$ dimension, as shown in FIG. 7. This nitride liner etch-back process produces a plurality of divots 910. The divots 910 are formed from the gap between the oxide liner 410 and the local isolation oxide region 610 that had previously been occupied by the nitride liner 510. In some cases, the divots 910 may be referred to as nitride divots. The divots 910 are formed adjacent to substantially all of the fins 330. In this manner, the silicon nitride is intentionally recessed prior to performing deposition of a gate oxide layer.

Figure 8:
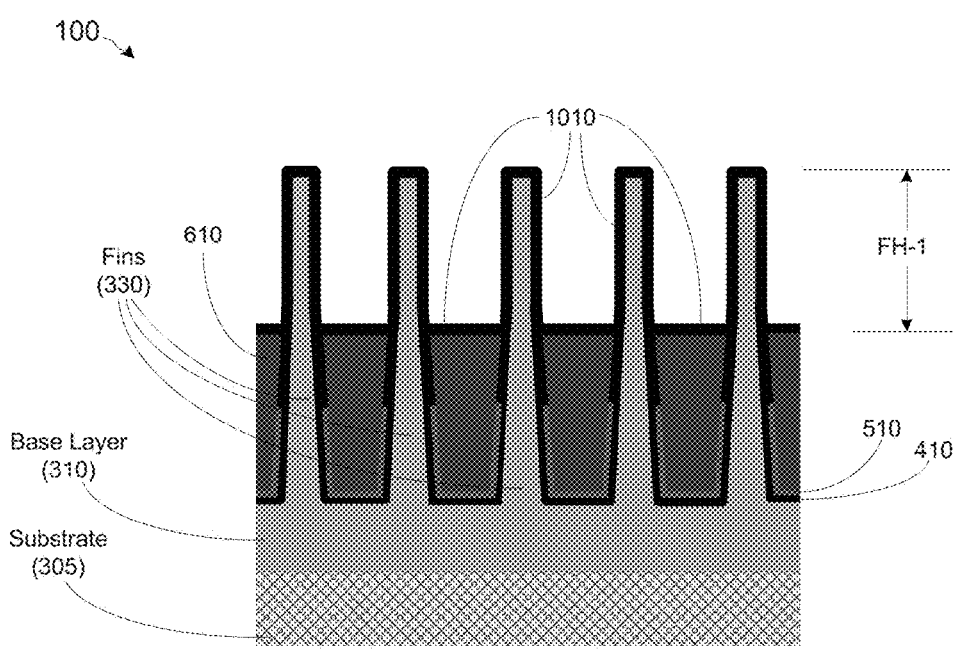
FIG. 8 illustrates a stylized cross-sectional depiction of the finFET device under manufacture with respect to a dummy gate oxide deposition process, in accordance with embodiments herein.

FIG. 8 illustrates a stylized cross-sectional depiction of the finFET device under manufacture with respect to a dummy gate oxide deposition process, in accordance with embodiments herein. Once the divots 910 are formed, a dummy gate oxide deposition process may be performed in the predetermined area designed for forming gates. In one embodiment, an atomic layer deposition (ALD) process may be performed for depositing dummy EG oxide over the fins 330 in the gate regions and into the divots 910. In other embodiments, an IRAD EG oxide deposition process may be performed for depositing dummy EG oxide into the divots 910.

The gate oxide deposition process results in a gate oxide layer 1010 (e.g., EG oxide) formed on all of the fins 330. The deposition of the dummy oxide layer 1010 results in formation of a set of fins that have an effective first fin height (FH-1), which represents a height from the top portion of the filled in divots 910 to the top portion of the fins 330, as shown in FIG. 8. As described in further details below, as a result of subsequent processing performed in the S/D region (e.g., EPI process, POC process, etc.), the effective height of the fins in the S/D region (i.e., FH-1 in the S/D region) increases relative to the fins in the gate region. Therefore, the effective height of fins in the gate regions is initially smaller relative to the fins in the S/D regions. However, since nitride liners were recessed prior to forming dummy gate regions, only partial removal of the local isolation oxide layer 610 in the gate regions, partial removal of the oxide liner 410, and partial removal of the gate oxide layer 1010 may be performed to increase the effective fin height in the gate region (as shown later in FIGS. 14-16 and described in further details below). That is, since nitride liners were previously recessed, in order to increase the effective fin height in the gate regions, only oxide recessing is required, and additional nitride recessing processes are not required. Since additional nitride liner recessing is not required, an oxide recess process may be performed selectively in the gate regions for increasing the effective fin height of the gate regions without substantially damaging existing nitride spacers that are generally formed for providing isolation between S/D regions and gate regions. Those skilled in the art having benefit of the present disclosure would appreciate that this process may involve additional steps known to those skilled in the art, such as performing selective etching, masking the S/D regions, covering the S/D region with inter-layer dielectric material (ILD) material, etc. Therefore, without having to perform additional nitride liner recess processes, embodiments herein provide for effective fin height in a gate region that are equal to, or have slightly greater effective height relative to the fins in the S/D regions. Since the effective height of the fins in the gate regions are increased without additional nitride liner recess, nitride liners between gate and S/D regions are left intact, therefore, isolation between gate regions and S/D contact formations of the finFET device 100 may be preserved while increasing the effective height of fins in the gate regions (as further illustrated in FIGS. 13-15).

Figure 9:
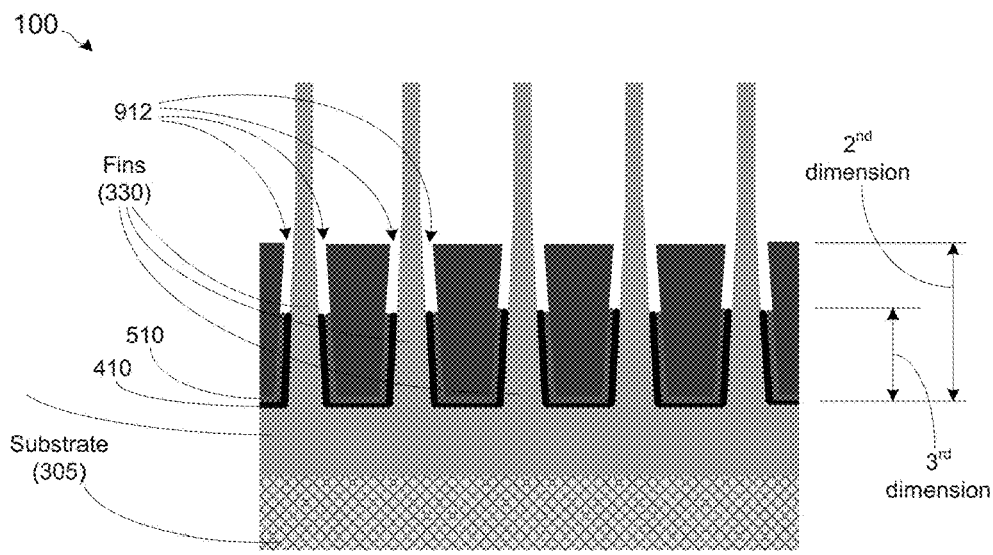
FIG. 9 illustrates a stylized cross-sectional depiction of the finFET device under manufacture with respect to a second oxide liner removal process, in accordance with embodiments herein.

FIG. 9 illustrates a stylized cross-sectional depiction of the finFET device 100 under manufacture with respect to a further oxide liner removal process, in accordance with an alternative embodiment herein. In an alternative embodiment, following the partial removal of the nitride liner as shown in FIG. 7, a further oxide liner removal process may be performed, wherein the oxide liner 410 adjacent the divot 910 may be removed, creating a slightly wider set of divots 912 relative to the width of the divots 910 of FIG. 7.

Subsequently, gate oxide material 1010 may then be added into the larger divot 912, similar to the process of adding the gate oxide material into the divot 910 of FIG. 7. As a result of depositing the gate oxide material 1010 into the divot 912, the device 100 will be in a substantially similar condition as shown in FIG. 8.

Figure 10:
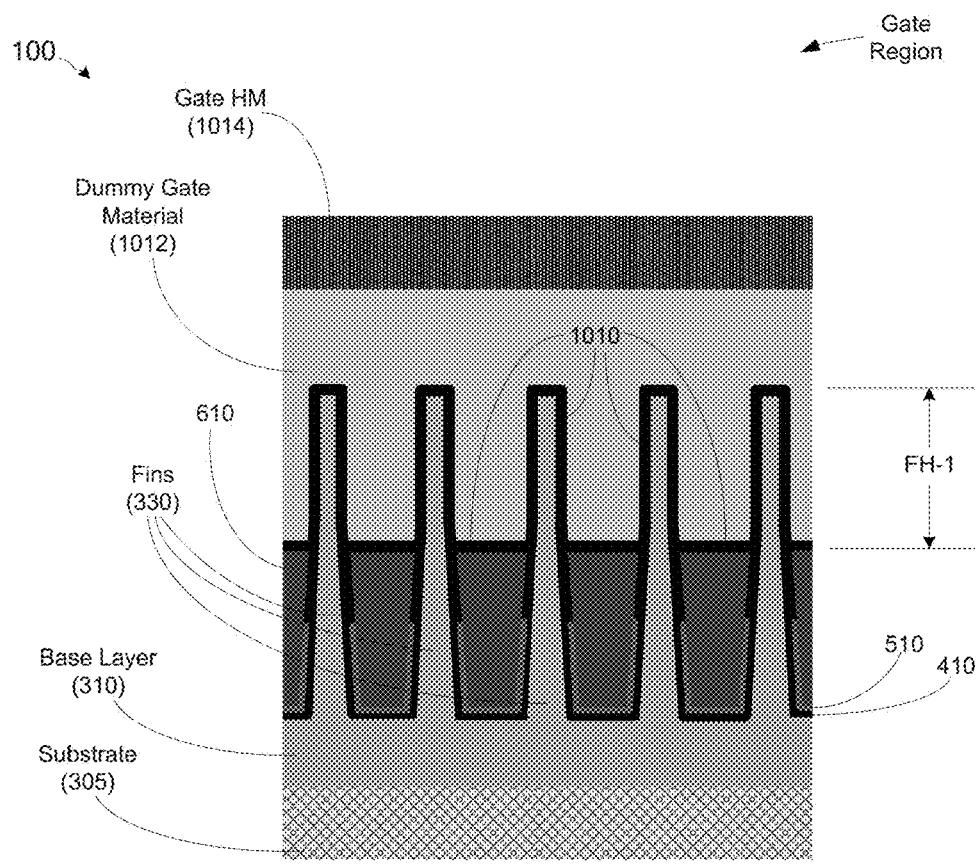
FIG. 10 illustrates a stylized cross-sectional depiction of the finFET device under manufacture with respect to a dummy gate a-Si deposition process, in accordance with embodiments herein.

FIG. 10 illustrates a stylized cross-sectional depiction of the finFET device under manufacture with respect to a dummy gate a-Si deposition process, in accordance with embodiments herein. A protective gate layer 1012 (e.g., dummy gate layer comprising amorphous silicon (a-Si)) may be deposited above the gate oxide layer 1010, as shown in FIG. 10. A gate hard mask layer 1014 may be deposited above the dummy gate layer 1012. Those skilled in the art having benefit of the present disclosure would appreciate that further gate processing (e.g., gate patterning, etch processes, etc.) may be performed for forming gates. Further, the protective layer 1012 provides for isolating the gate region when performing processing steps in the S/D regions.

Figure 11:
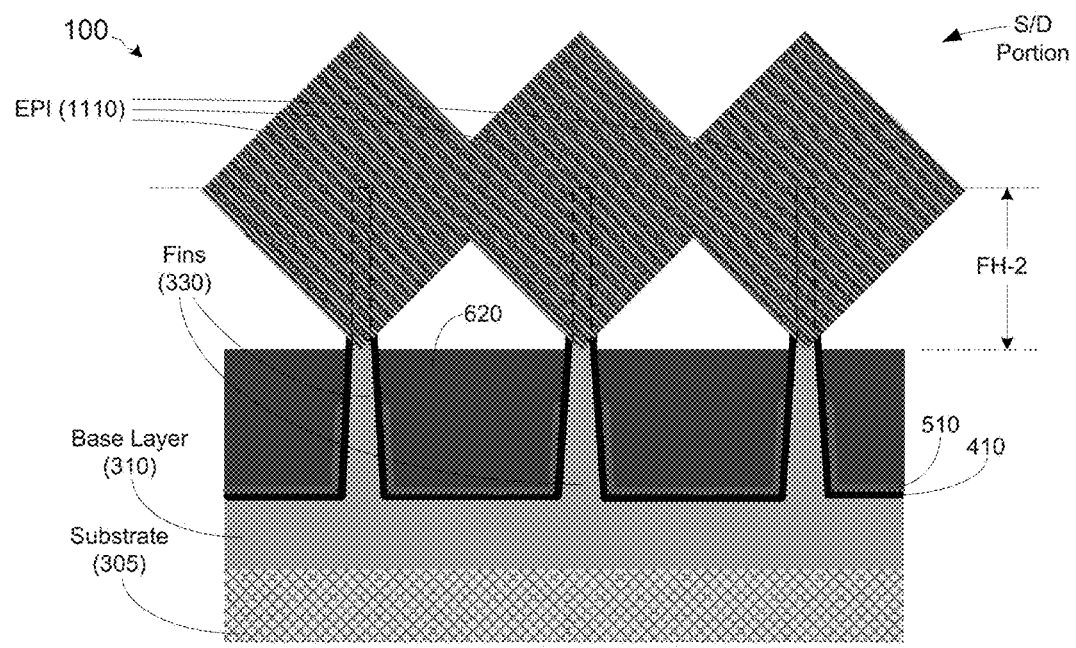
FIG. 11 illustrates a stylized cross-sectional depiction of the finFET device under manufacture with respect to epitaxial (EPI) layer growth process, in accordance with embodiments herein.
Figure 12:
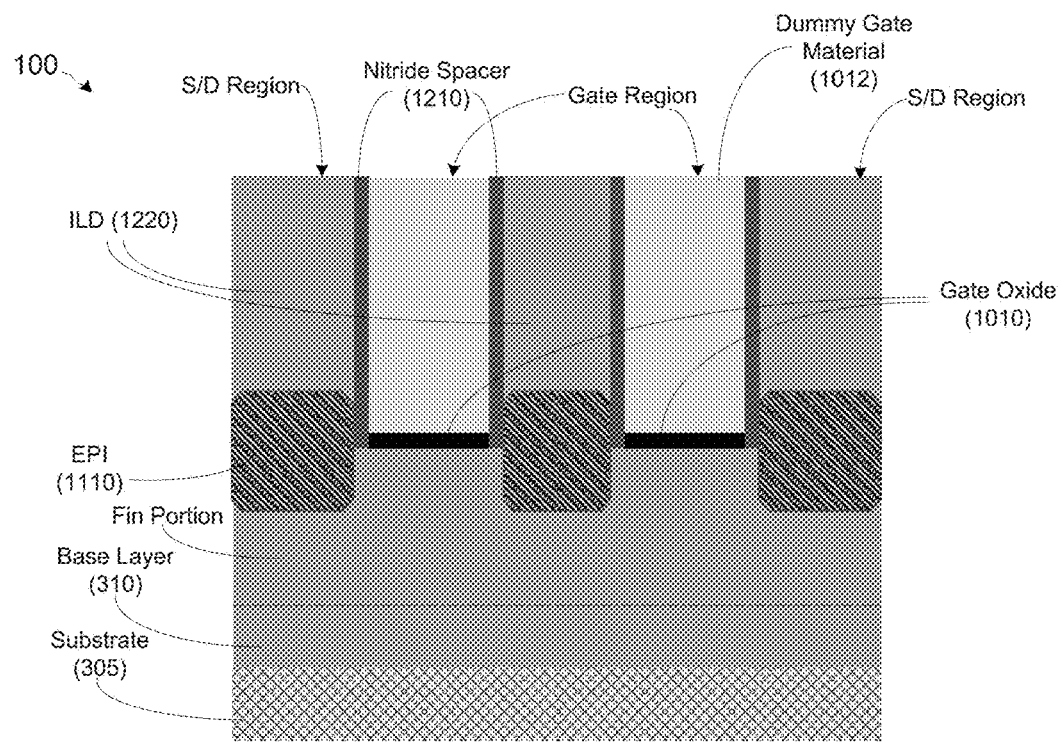
FIG. 12 illustrates a stylized, cross-sectional view of the device across a single fin and is a perpendicular view relative to the view of the device shown in FIG. 9, in accordance with embodiments herein.
Figure 13:
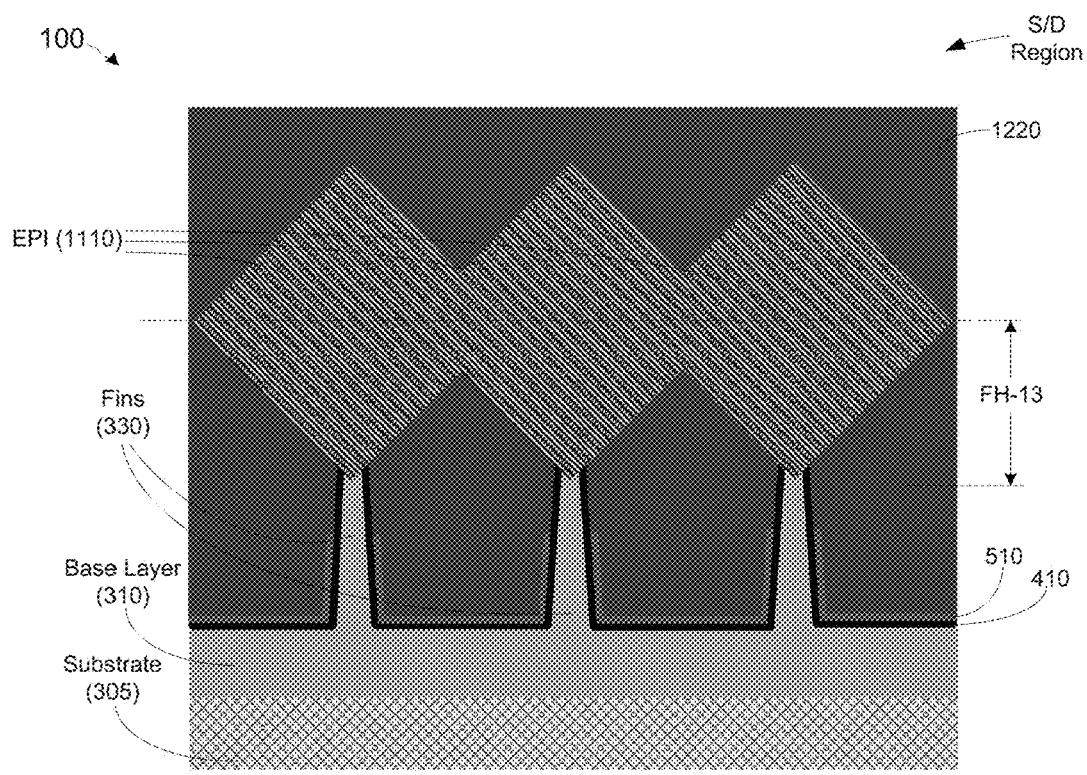
FIG. 13 illustrates a stylized, cross-sectional view of the device across a plurality of fins portions outside the gate region, and is a perpendicular view relative to FIG. 11, in accordance with embodiments herein.

Turning now to FIGS. 11-13, processes affecting the formation of the fins 330 within S/D regions are now discussed. FIG. 11 illustrates a stylized cross-sectional depiction of the finFET device 100 under manufacture with respect to a source/drain epitaxial (EPI) layer growth process, in accordance with embodiments herein. Those skilled in the art having benefit of the present disclosure would appreciate that additional process steps are performed to form EPI formations in the S/D region. For example, a mask may be implemented on the gate regions, followed by formation of nitride liner formation to provide isolation between the S/D regions and the gate regions. Subsequently, EPI formations are formed in the S/D regions.

In many cases, due to different processes being performed on fins portions in the S/D portions, those fins portions (in the S/D regions) tend to have greater effective height relative to the effective height of fins portions in the gate region. This increase in effective fin height in the S/D region may occur due to various processes specific to the fin in S/D regions, such as spacer RIE, EPI pre-clean process, etc. This may cause an increase in the effective fin height in S/D regions relative to effective height of the fin portions in the gate regions, which could cause adverse effects, such as current leakage.

At the top portions of the fins 330 in the S/D regions, an EPI depositions/growth process may be performed. The nitride liner 510 covers a portion of the fins 330, while the oxide liner 410 covers another portion of the fins 330. A layer of local isolation oxide region 620 is shown within the spaces between the fins 330. The local isolation oxide region 620 (FIG. 11) may be thinner than the local isolation oxide region 610 (FIG. 8) since FH-2 (FIG. 11) is higher than FH-1 (FIG. 10). In one embodiment, the effective fin height in the S/D region is the portion of some or all of the fins 330 in the S/D region that are exposed with respect to partial removals of the oxide liner 410, the nitride liner 510, and/or the local isolation material 610. As shown in FIG. 11, EPI features 1110 are formed on the fins 330 outside the gate region, i.e., on the fins in the S/D regions.

In some embodiments, the EPI features 1110 may be grown to a size in the range of about 5 nm to about 20 nm (lateral EPI width). The EPI features 1110 may be deposited using a chemical vapor deposition process (CVD), e.g., reduced pressure CVD (RPCVD), ultra-high vacuum CVD (UHVCVD), metal organic CVD (MOCVD), etc. The precursors for the EPI features 1110 may comprise gases comprising silicon (e.g., $SiH_4$, $Si_2H_4Cl_2$, $Si_2H_6$, $Si_3H_8$) and/or gases comprising germanium (e.g., $GeH_4$). The partial pressures of these gases may be adjusted to adjust the atomic ratio of germanium to silicon. In one embodiment, the EPI layers may be grown at 700° C., and may be decreased to 550° C. with source gas.

The deposition of the EPI features 1110 may be performed as a plurality of deposition-etch cycles. As illustrated in FIG. 11, generally, the shape of the EPI features 1110 upon deposition may be generally a diamond shape immediately after EPI growth. As would be appreciated by those skilled in the art having benefit of the present disclosure, further processing of the device 100 may cause the shape of the EPI formation to change from a diamond shape to a more rounded shape.

Various process steps known to those skilled in the art may be performed with regard to forming the EPI features 1110, including spacer RIE, EPI pre-clean processes, etc. These processes often cause the effective fin height (i.e., FH-2) of the fins in the S/D region (e.g., an exposed portion of the fins 330 in the S/D region) to be greater, as opposed to the effective fin height (i.e., FH-1) of the fins in the gate regions, which do not experience the EPI growth process, and thus does not experience an increase in effective fin height. That is, compared to the effective fin height FH-1 of FIG. 8, the effective fin height of FIG. 11 (i.e., FH-2) is larger. As noted above, the increase in effective fin height (i.e., FH-2 versus FH-1) may be due to several process factors, such as effects from performing various processes, such as spacer RIE, EPI pre-clean process, etc. Since these process steps are not performed on fin portions inside gate regions, without having implemented embodiments herein, the effects of these processes would have resulted in the effective height of the fins in the gate regions being smaller than the effective height of the fin portions outside the gate regions (i.e., in the S/D regions). These effective height variations may have caused adverse effects, such as current leakage. However, embodiments herein provide for reducing the differences between the increased effective fin height in the S/D region caused by certain processes specific to the S/D region, and the effective fin height in the gate region, thereby reducing the probability of such adverse effects.

As a result of the creation of divots 910 and/or nitride liner etch back process being performed prior to the deposition of the dummy oxide layer 1010 (as illustrated in FIGS. 7-8), further reduction of the oxide liner 410 may be performed to cause the effective fin height within the gate regions are to be slightly larger, as discussed in further details below.

In some embodiments herein, at this point, the effective fin height in the gate region is smaller than the effective fin height in the S/D regions. An increase of the fin height in the gate region may be achieved by performing an oxide recess process without having to perform an additional nitride recess process. In one embodiment, by controlling oxide liner recess for increasing the fin height in the gate region, the fin height in the gate region may be substantially matched with the fin height in the S/D regions. In some embodiments, substantially matching may include matching within a predetermined range of tolerance, e.g., 5%, 10%, 15%, 20%, or 25%. In some embodiments, this reduction in the oxide liner may be performed during the replacement gate-related (RMG-related) processes.

The reduction of only the oxide material provides for maintaining the nitride spacer 1210 between the gate regions and the S/D regions, providing sufficient isolation between those regions. Thus, after the increase of the effective fin height outside the gate regions (i.e., FH-2 in the S/D regions) as a result of the EPI-related processes performed on the S/D fins, by employing embodiments herein, the increase in the effective fin height within the gate regions results in the respective effective fin heights of the gate and S/D regions to become substantially similar. This promotes a reduction and/or prevention of adverse effects, such as current leakage. These effective fin height differences are further described below.

Figure 14:
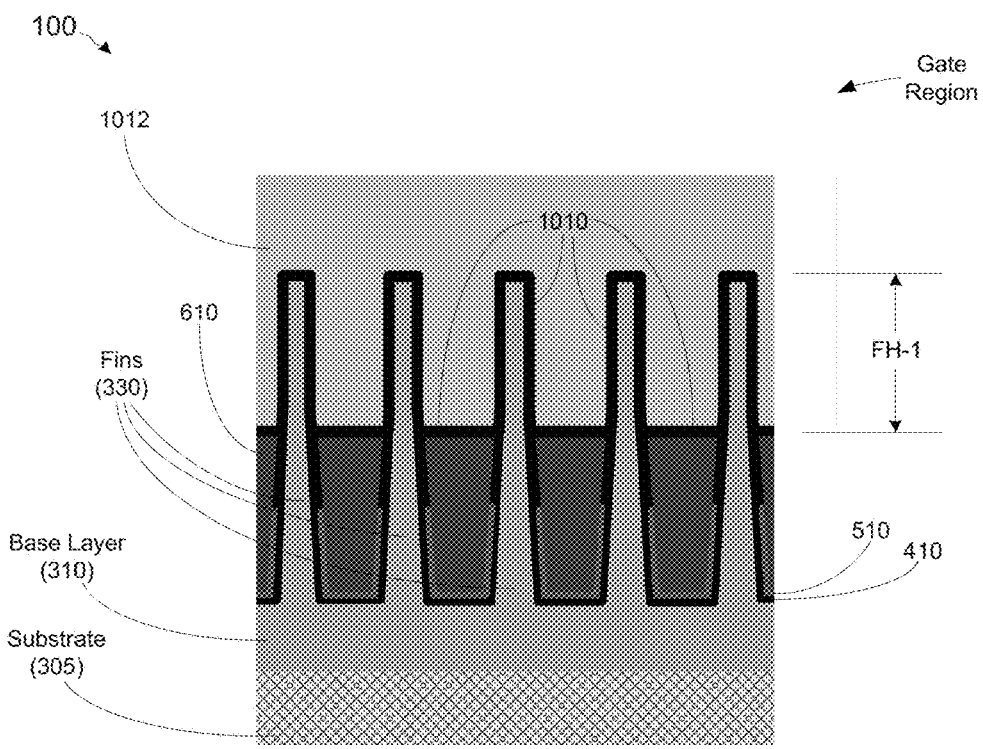
FIG. 14 illustrates a stylized, cross-sectional view of the device across a plurality of fins portions inside the gate region, and is a perpendicular view relative to FIG. 11, in accordance with embodiments herein.
Figure 15:
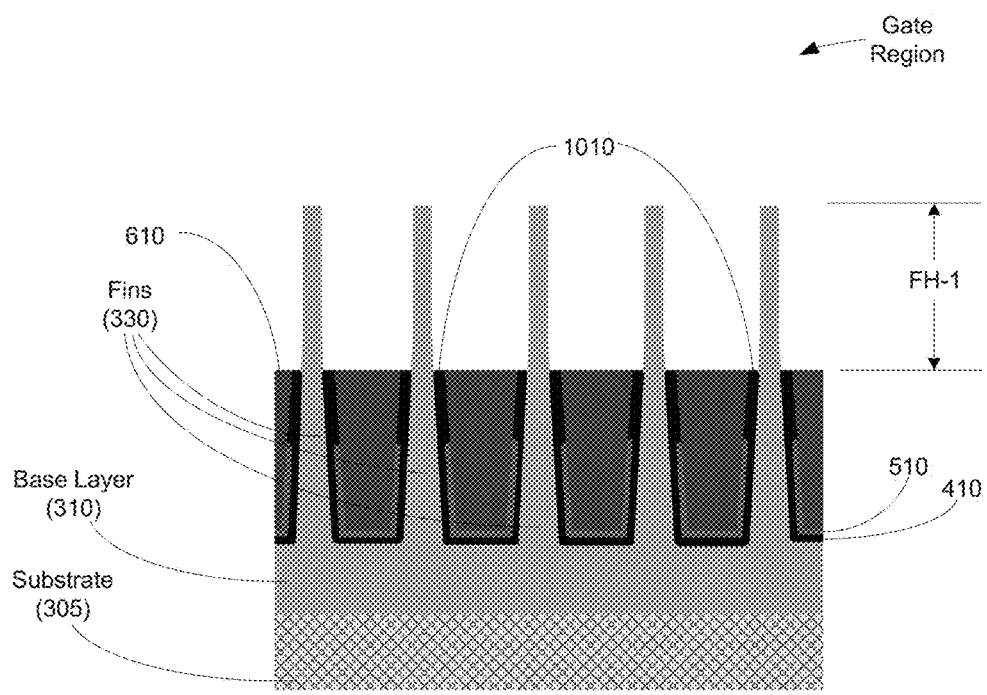
FIG. 15 illustrates a stylized, cross-sectional view of the device across a plurality of fins portions inside the gate region, of a dummy gate layer, in accordance with embodiments herein.
Figure 16:
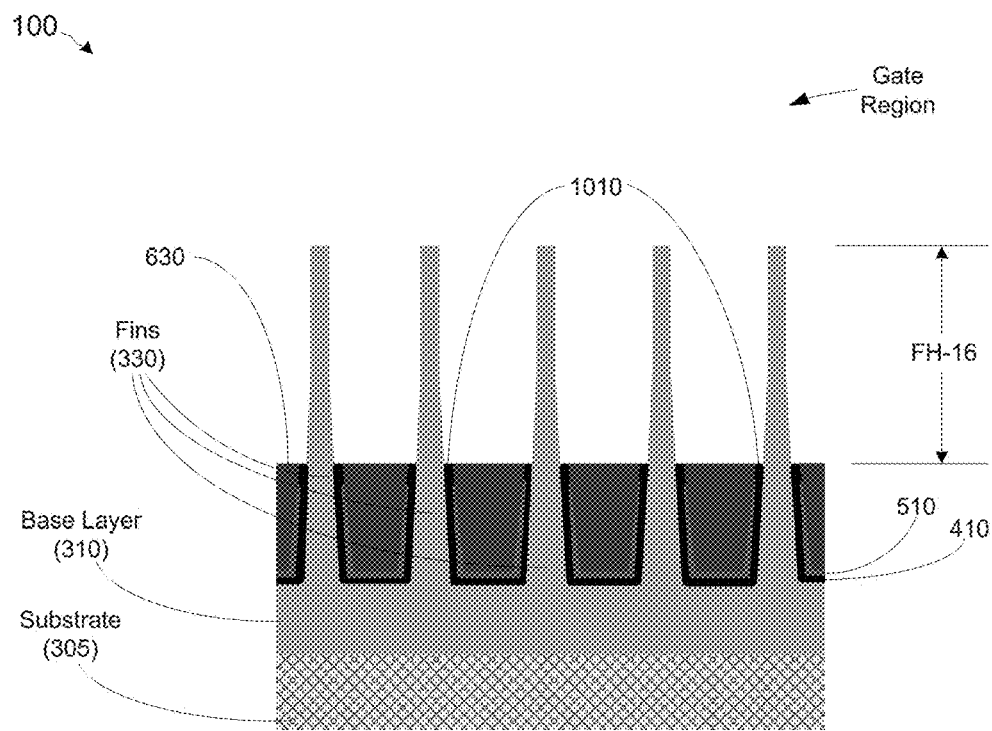
FIG. 16 illustrates a stylized, cross-sectional view of the device across a plurality of fins portions inside the gate region, after partial removal of a gate oxide and a local oxide isolation region.

Upon post-EPI process, a poly open CMP (POC) process may be performed. The POC process readies the finFET device 100 for replacing the dummy gate oxide material and replacing those portions with metal gate material by performing a replacement metal gate (RMG) process. FIG. 12 illustrates a stylized, cross-sectional view of the device across a single fin and is a perpendicular view relative to the view of the device shown in FIG. 11. FIG. 13 illustrates a stylized, cross-sectional view of the device across a plurality of fins portions outside the gate region, and is a perpendicular view relative to FIG. 12. FIGS. 14-16 illustrate stylized, cross-sectional views of the device across a plurality of fins portions inside the gate region, and are perpendicular views relative to FIG. 12.

Further, FIGS. 14-16 illustrate stylized, cross-sectional views of the device across a plurality of fins portions inside the gate region with respect to removing the dummy gate layer 1012, removing a portion of the gate oxide 1010 and a portion of the local oxide isolation region 610. Referring simultaneously to FIGS. 12-16 the POC process results in the extraction of dummy oxide material (shown in FIGS. 15 and 16) from the gate regions. In some embodiments, during this process, a portion of the oxide liner 410 may be reduced to increase the effective fin height of the fins in the gate region, as later described in FIG. 16. The recessing of the nitride liner 510 at the earlier stage described above obviates the need to recess nitride at this time, thereby preserving the nitride spacer 1210. The gate regions are separated from the fin portions outside the gate region (i.e., the S/D regions) by the nitrile spacers 1210 (FIG. 12). FIG. 12 shows the EPI features 1110 and regions of inter-layer dielectric material (ILD) 1220 in the regions outside the gate regions, which are separated by the nitride spacers 1210. Later, after the dummy gate material 1012 shown in FIG. 12 is removed, the resulting voids in the gate region will be filled with RMG material during an RMG process.

FIG. 13 shows a cross-sectional view that is perpendicular relative to FIG. 12 and depicts the fin region outside the gate regions. FIG. 13 shows the ILD region 1220 and the EPI features 1110. Based upon the post EPI processes, the effective fin height (FH-13) in the fin regions outside the gate regions becomes slightly higher. However, by having performed the recessing process on the nitride layer 510 (FIG. 7) prior to performing the gate oxide deposition (FIG. 8), an opportunity to efficiently recess a sufficient portion of the oxide liner 410, the gate oxide 1010, and/or the local isolation oxide region 610 is provided, such that a greater effective fin height (FH-16) is provided inside the gate region, as shown in FIG. 16. This prevents the fins 330 in the gate regions from having smaller effective height relative to the effective height of the fins 330 in the S/D regions. In one embodiment, the effective fin height in the gate region is the portion of some or all the fins 330 in the gate region that are exposed with respect to partial removal of the oxide liner 410, the nitride liner 510, and/or the local isolation material 610.

FIG. 14 shows that the gate hard mask layer 1014 is removed, leaving the a-Si layer 1012 in the gate region. A protective gate removal process (e.g., an a-Si layer removal process) may be performed to remove the a-Si layer 1012, as shown in FIG. 15. Further, an oxide removal process may be performed to remove a portion of the gate oxide material 1010, down to the level of the local isolation oxide region 610, as shown in FIG. 15. At this juncture, the height of the fins 330 (e.g., an exposed portion of the fins 330 in the gate region) in the gate region is FH-1. As noted above, due to the processes performed in the S/D regions, the effective fin height in the S/D region (FH-2) is greater than the effective fin height in the gate region (FH-1).

In order to increase the effective fin height in the gate region relative to the fin height in the S/D region, an oxide removal process may be performed (FIG. 16). The oxide removal process removes a further portion of the gate oxide layer 1010, an additional portion of the oxide liner 410, and an additional portion of the local isolation oxide region (labeled with the reference number 630), as shown in FIG. 16. The oxide removal process lowers the level of the local isolation oxide region 610, the oxide liner 410, and the gate oxide layer 1010 to a predetermined level, resulting in an increase in the effective fin height (e.g., an increased exposed portion of the fins 330 in the gate region) of the gate region from FH-1 (FIG. 15) to FH-16 (FIG. 16).

In some embodiments, a determination may be made as to the amount of relative difference between the effective fin height in the gate region relative to the fin height in the S/D region. In response, a determination as to the amount of etch back to be performed may then be made in order to reduce the relative difference between the effective fin height in the gate region relative to the fin height in the S/D region. This determination may then be used to perform the etch-back of the local isolation oxide region 610, the oxide liner 410, and the gate oxide layer 1010, thereby increasing the effective fin height (FH-16) in the gate region (FIG. 16). This results in the reduction of the amount of relative difference between the effective fin height in the gate region and the effective fin height in the S/D region.

In some embodiments, the amount of increase in the effective fin height in the S/D regions is substantially equal to the difference between increased effective fin height in the gate region (i.e., FH-16) and the effective fin height in the gate region prior to performing the etch back step (i.e., FH-1) shown in FIG. 16. In this manner, the increase in the effective fin height in the S/D region is compensated for by the increase in the effective fin height in gate region.

In some alternative embodiments, the local isolation oxide region 630 may be of a different dimension as compared to the dimensions shown in FIG. 16, and yet provide an effective fin height FH-16 that is equal to or greater than the effective fin height FH-1.

Figure 17:
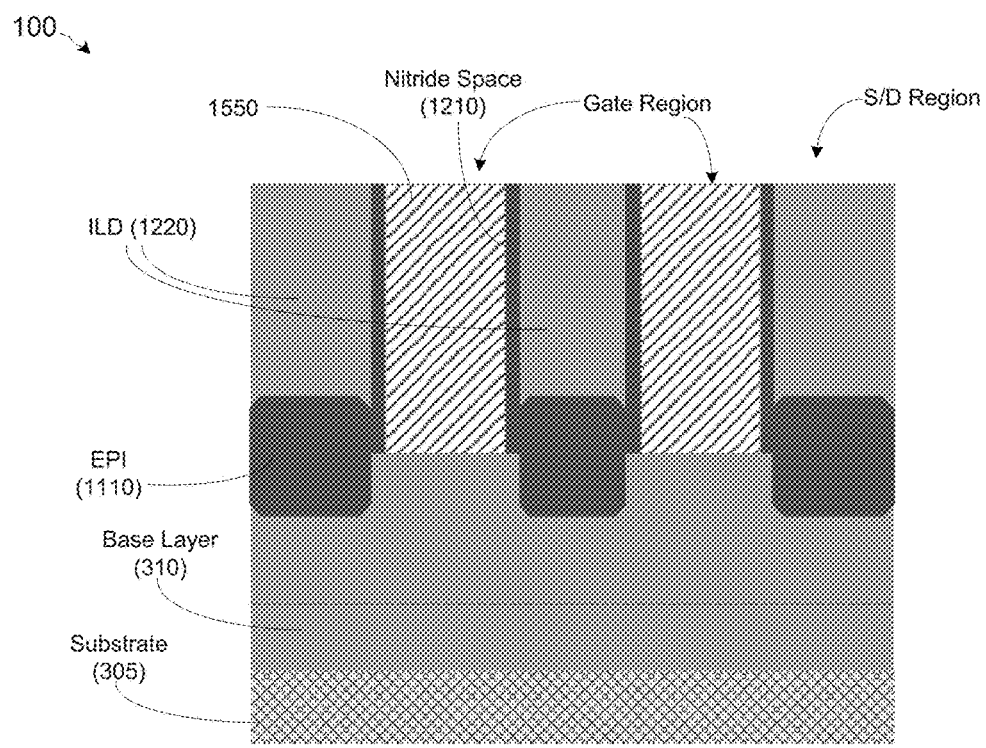
FIG. 17 illustrates a stylized, cross-sectional view of the device across a single fin and is a perpendicular view relative to the view of the device shown in FIG. 12.
Figure 18:
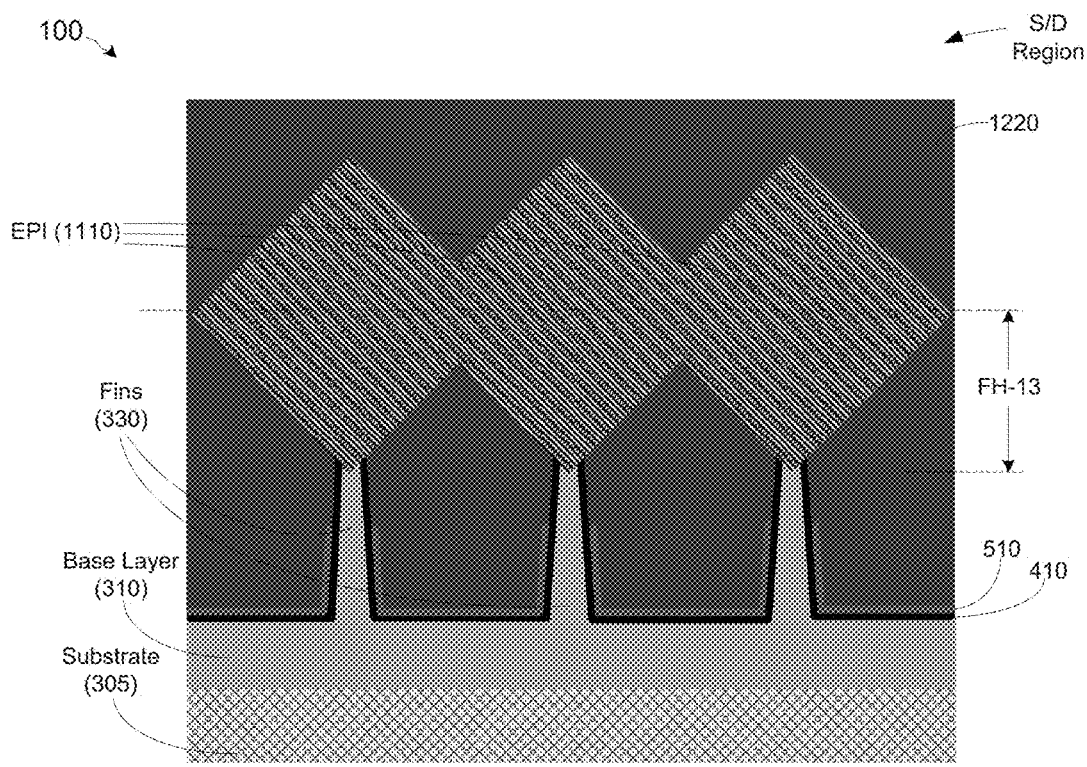
FIG. 18 shows a cross-sectional view that is perpendicular relative to FIG. 13 and depicts the fin region outside the gate regions, in accordance with embodiments herein.
Figure 19:
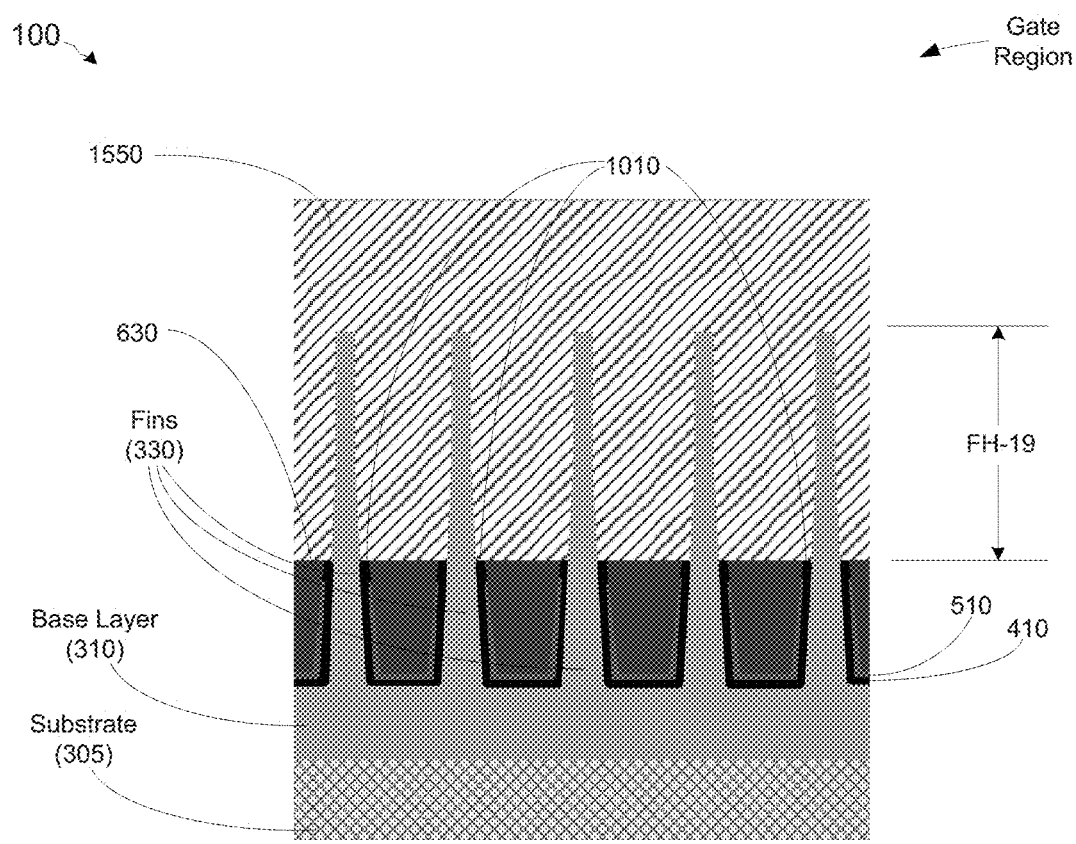
FIG. 19 shows a cross-sectional view that is perpendicular relative to FIG. 13 and depict the fin region inside the gate region, in accordance with embodiments herein.

FIGS. 17, 18, and 19 illustrate stylized cross-sectional depictions of the finFET device under manufacture with respect to a replacement metal gate (RMG) process, in accordance with embodiments herein. Upon the post-POC process, an RMG process is performed. The RMG process replaces the dummy gate region with RMG material. FIG. 17 illustrates a stylized, cross-sectional view of the device across a single fin and is a perpendicular view relative to the view of the device shown in FIG. 16. FIG. 18 illustrates a stylized, cross-sectional view of the device across a plurality of fins portions outside the gate region, and is a perpendicular view relative to FIG. 17. FIG. 19 illustrates a stylized, cross-sectional view of the device across a plurality of fin portions inside the gate region, and is a perpendicular view relative to FIG. 17.

Referring simultaneously to FIGS. 17, 18, and 19, the RMG process results in depositing RMG material into the void areas in the gate regions that were created when the dummy gate layers were removed. A metallization process is performed to fill the gate regions to provide high-k metal gates (HKMG). The gate regions are filled with metal (e.g., tungsten, copper, etc.), replacing the dummy gate oxide with gate metal material. In some embodiments, this metallization process may involve depositing a metal liner (e.g., titanium-nitride ["Ti-Nitride" or "TiN"] over a thin Ti film), followed by filling with tungsten. In some embodiments, cobalt can also be used for contact metal instead of tungsten. FIG. 17 shows the filled gate regions 1550, which are separated from the ILD material 1220 in the S/D regions by the nitride liner 1210.

FIG. 18 shows a cross-sectional view that is perpendicular relative to FIG. 17 and depicts the fin region outside the gate regions, i.e., in the S/D regions. FIG. 18 shows the ILD region 1220 and the EPI features 1110. FIG. 19 shows a cross-sectional view that is perpendicular relative to FIG. 17 and depicts the fin region inside the gate region. The gate regions are formed into high-k metal gate (HKMG) regions 1550. The nitride liners 510 separate the fins 330 in the gate regions. As shown below, the effective height of the fins in the gate region are higher (FH-19) than they would have been had the nitride liner layer 510 not been recessed earlier in the process and the divots 910 (FIG. 7) were not filled by an oxide material.

Figure 20:
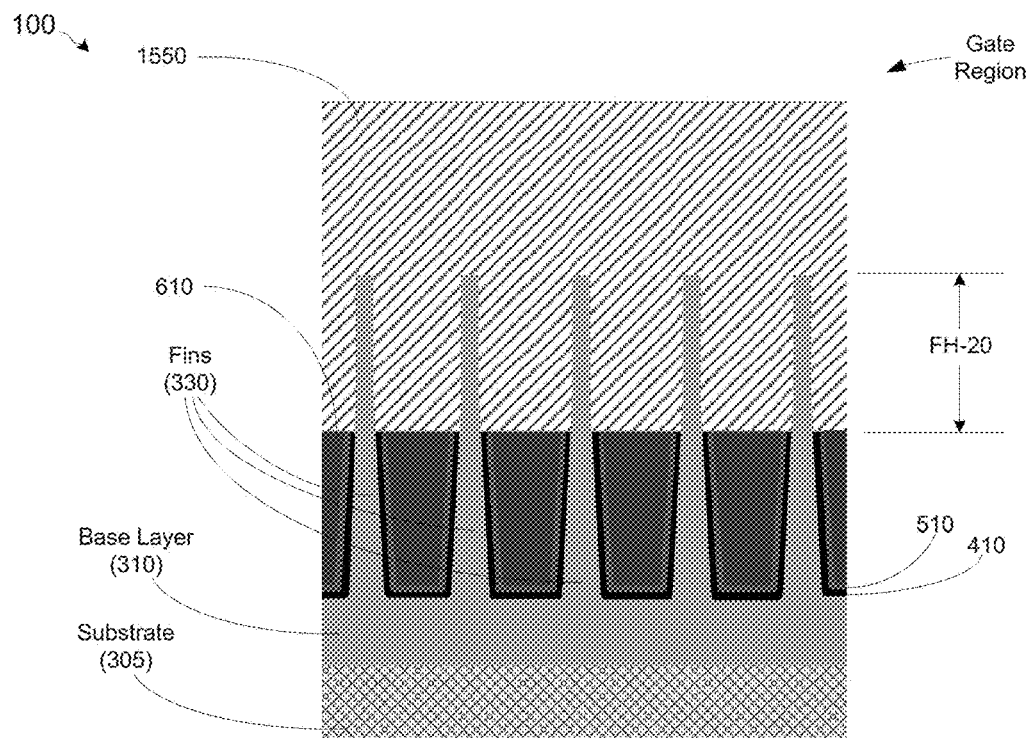
FIG. 20 illustrates a stylized cross-sectional view of the cross-sectional view of the finFET device across a plurality of fins portions inside the gate region, and is a perpendicular view relative to FIG. 13, wherein the device was processed by not performing the liner etch back and divot oxide fill processes prior to performing the dummy EG oxide fill.

FIG. 20 illustrates a stylized cross-sectional view of the cross-sectional view of the finFET device across a plurality of fins portions inside the gate region, and is a perpendicular view relative to FIG. 17, wherein the device was processed by not performing the liner etch back and divot oxide fill processes prior to performing the EPI, POC, and RMG processes. This would lead to a smaller effective fin height (FH-20) inside the gate region, as compared to the effective height of the fins in the S/D region. Further, with respect to FIG. 20, since the nitride liner 510 was not reduced to create the divots shown in FIG. 7, the effective fin height of FIG. 20 cannot be increased by simply performing an oxide recess process, in contrast to embodiments provided herein.

Figure 21:
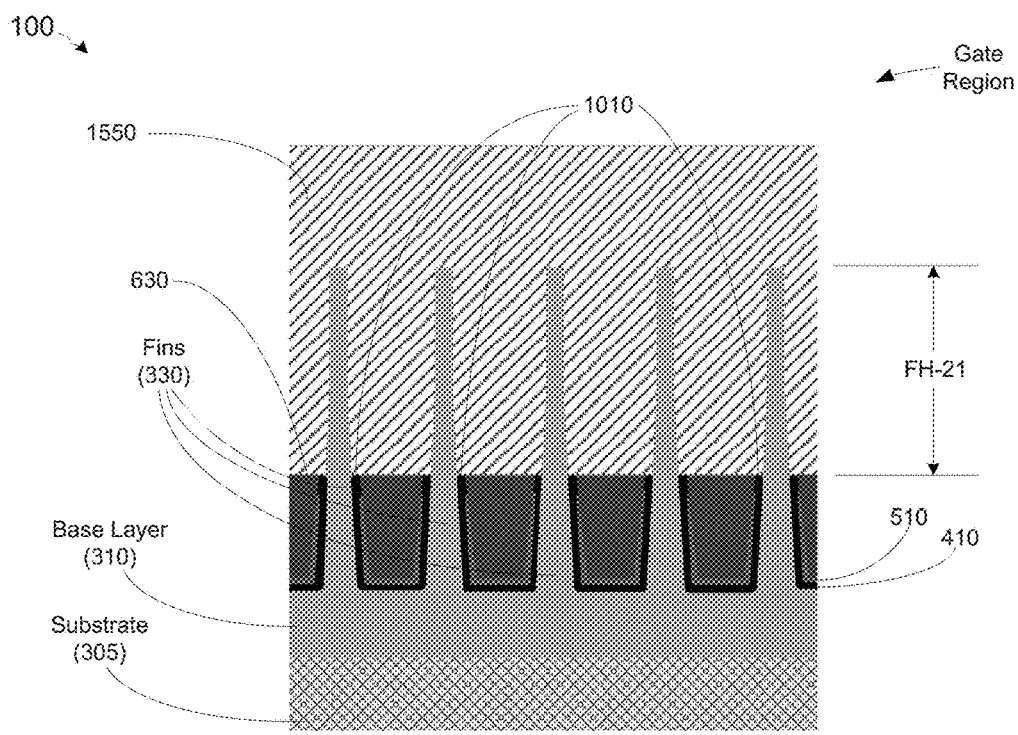
FIG. 21 illustrates a stylized cross-sectional view of the finFET device across a plurality of fins portions inside the gate region, and is a perpendicular view relative to FIG. 13, wherein the device was processed by performing the liner etch back and divot oxide fill processes prior to performing the dummy EG oxide fill, in accordance with embodiments herein.

In contrast to FIG. 20, FIG. 21 illustrates a stylized cross-sectional view the finFET device across a plurality of fins portions inside the gate region, and is a perpendicular view relative to FIG. 17, wherein the device was processed by performing the liner etch back and divot oxide fill processes prior to performing the EPI, POC, and RMG processes. This would allow increasing the effective height of the fins in the gate portions by recessing a portion of the oxide liner 410 without having to recess the nitride liner 510, thereby preserving the nitride space 1210 between the gate portions and the S/D portions. This would lead to a higher effective fin height (FH-21) inside the gate region. The higher effective fin height FH-21 matches more effectively with the effective fin height outside the gate regions (i.e., fins in the S/D regions) such that process problems (e.g., current leakage) may be reduced.

Further processes known to those skilled in the art having benefit of the present disclosure would be performed to complete the processing of the finFET device. For example, further processing steps (e.g., source/drain (S/D) formation, silicide process, back-end-of-line (BEOL) may be performed to form MOSFET devices using FinFET processes. The drain and source regions for an NMOS device may be formed from n-doped silicon or low germanium percentage SiGe material. The drain and source regions for a PMOS device may be formed from p-doped germanium or high germanium percentage SiGe material. Accordingly, the processes exemplified herein may be used to provide N-FET and/or P-FET devices using the same base semiconductor structure.

Figure 22:
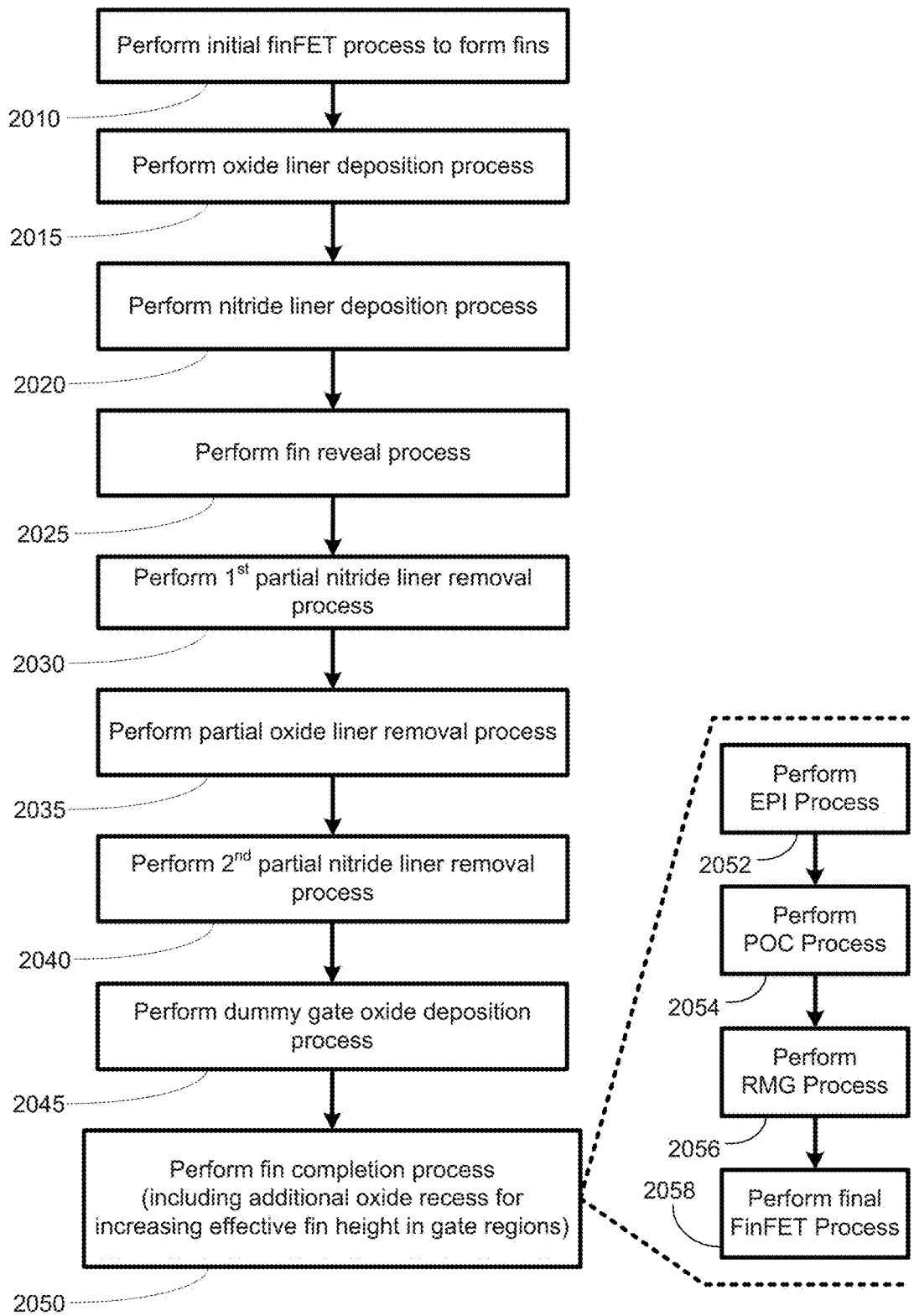
FIG. 22 illustrates a flowchart depiction of the process steps of providing a finFET device, in accordance with embodiments herein.

Turning now to FIG. 22, a flowchart depiction of the process steps of providing a finFET device with adjustable fins in the gate region, in accordance with embodiments herein, is illustrated. An initial process for forming a plurality of fins on a substrate is performed (block 2010). The fins may be formed using techniques known to those skilled in the art having benefit of the present invention. Upon forming the fins, an oxide liner process may be performed (block 2015). In one embodiment, a dielectric material, such as silicon dioxide, silicon nitride, silicon carbide and the like, may be formed above the fins (see e.g., FIG. 2). The deposition of the dielectric material may be accomplished on the basis of well-established deposition techniques, such as plasma enhanced chemical vapor deposition (CVD), thermally activated CVD, spin-on techniques, an ISSG oxide deposition process, etc., depending on the material characteristics required.

Subsequently, a nitride liner may be deposited on the fin (block 2020). In one embodiment, a thin layer of silicon nitride may be implemented, as exemplified in FIG. 3. In one embodiment, the nitride liner 510 may be provided by performing an iRAD process. A fin reveal process may be performed (block 2025). This process may include depositing a dielectric material, such as a flow oxide material, and performing a fin reveal etching process for revealing the fins to a predetermined height, as exemplified in FIG. 4.

A first liner removal process may then be performed to remove a portion of the nitride liner described above (block 2030). In one embodiment, a first hot phosphorus nitride liner removal process may be performed for removing a portion of the nitride liner, as exemplified in FIG. 5. Subsequently, an oxide liner removal process may be performed for removing a portion of the oxide liner, down to level of the nitride liner level (block 2035). Further, a portion of the local isolation oxide region may also be removed to lower the height of the local isolation oxide region, as exemplified in FIG. 6. This process partially exposes the nitride layer.

Subsequent to partially exposing the nitride layer, a second nitride liner removal process may be performed (block 2040). In one embodiment, a second hot phosphorus nitride liner removal process may be performed for removing the subsequent portion of the nitride liner, as exemplified in FIG. 7. In another embodiment, a selective isotropic dry etch process may be used to perform this nitride line etch-back process. Removing this subsequent portion of the nitride liner below the level of the local isolation oxide region causes a plurality of divots to be formed.

The first and second nitride liner removal process may be performing using a dry etch process, such as a SiCoNi™ process, a remote plasma dry etch, such as chemical oxide removal (COR) or Frontier™, or RIE.

A dummy gate oxide deposition process is then performed in the predetermined area designed for forming a gate (block 2045). This process separates an S/D region from a gate region for forming one or more transistors, e.g., finFET MOSFET transistors, as exemplified in FIG. 10. This process provides for formation of fins in a gate region that are equal or have slightly greater height than the fins in the S/D regions.

Subsequent processes known to those skilled the art would then be performed to manufacture finFET devices that comprise compatible S/D fin height and gate fines (block 2050). This process includes performing an additional oxide recess process directed to reduce a portion of the oxide liner for increasing the effective fin height in the gate region(s). This process provides for increasing the effective fin height in the gate regions while preserving the integrity of the nitride spacers that provide for isolation between the gate regions and the S/D contacts. These processes may include performing an EPI growth/deposition process on fins in the S/D regions (block 2052), as exemplified in FIG. 13. The growth/deposition of the EPI features may be performed as a series of multiple deposition-etch cycles to form epitaxial features that are relatively conformal. In some embodiments, a determination may be made as to the amount of effective fin height increase resulting from the processes performed in the S/D regions. The amount of recess performed by the oxide recess process may be proportional to the amount of effective fin height increase due to the processes performed in the S/D regions. Therefore, in some embodiments, the increase in the effective fin height in the gate region may be based on the increase in the effective fin height in the S/D regions.

Further a POC process (block 2054) may be performed to prepare for performing an RMG process (see e.g., FIGS. 12-14). Upon performing the POC process, an RMG process (block 2056) is performed to form metal gates for the finFET device under manufacture (see e.g., FIGS. 17-21). Subsequent processes known to those skilled in the art having benefit of the present disclosure are performed (block 1058) to form the finFET device in accordance with embodiments herein.

Figure 23:
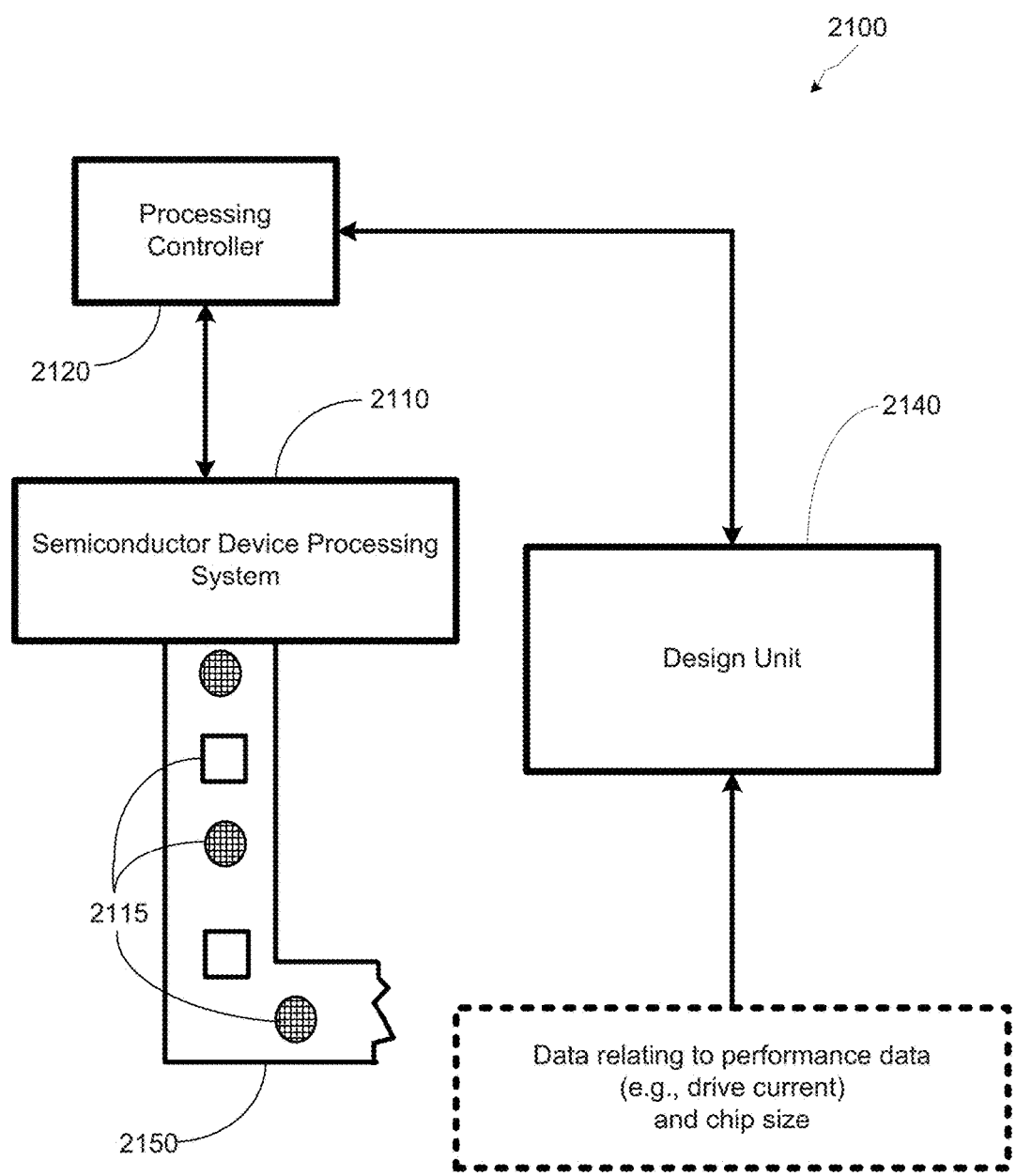
FIG. 23 illustrates a stylized depiction of a system for fabricating a semiconductor device package comprising finFET devices, in accordance with embodiments herein.

Turning now to FIG. 23, a stylized depiction of a system for fabricating a semiconductor device package comprising a topside interconnection substrate, in accordance with embodiments herein, is illustrated. The system 2100 of FIG.

23 may comprise a semiconductor device processing system 2110 and a design unit 2140. The semiconductor device processing system 2110 may manufacture integrated circuit devices based upon one or more designs provided by the design unit 2140. The system 2100 is capable of performing the process steps described in FIGS. 1-21.

The semiconductor device processing system 2110 may comprise various processing stations, such as etch process stations, photolithography process stations, CMP process stations, etc. One or more of the processing steps performed by the processing system 2110 may be controlled by the processing controller 2120. The processing controller 2120 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 2110 may produce integrated circuits on a medium, such as silicon wafers. More particularly, the semiconductor device processing system 2110 produce integrated circuits having finFET devices that have fins in the gate region that are compatible with S/D fins, e.g., the effective height of the gate fins being same or larger than the effective height of the fins in the S/D regions as to reduce performance or process problems, such as current leakage, etc., as described above.

The production of integrated circuits by the device processing system 2110 may be based upon the circuit designs provided by the integrated circuits design unit 2140. The processing system 2110 may provide processed integrated circuits/devices 2115 on a transport mechanism 2150, such as a conveyor system. In some embodiments, the conveyor system may be sophisticated clean room transport systems that are capable of transporting semiconductor wafers. In one embodiment, the semiconductor device processing system 2110 may comprise a plurality of processing steps, e.g., the 1$^{st}$ process step, the 2$^{nd}$ process set, etc., as described above.

In some embodiments, the items labeled "2115" may represent individual wafers, and in other embodiments, the items 2115 may represent a group of semiconductor wafers, e.g., a "lot" of semiconductor wafers. The integrated circuit or device 2115 may be a transistor, a capacitor, a resistor, a memory cell, a processor, and/or the like. In one embodiment, the device 2115 is a transistor and the dielectric layer is a gate insulation layer for the transistor.

The integrated circuit design unit 2140 of the system 2100 is capable of providing a circuit design that may be manufactured by the semiconductor processing system 2110. This may include information regarding the formation of divots and performing additional oxide and nitride liners prior to performing dummy gate oxide deposition. The integrated circuit design unit 2140 may be capable of determining the number of devices (e.g., processors, memory devices, etc.) to place in a device package. The integrated circuit design unit 2140 may also determine the height of the gate fins, the S/D fins, the dimensions of EPI growth on fins of the finFET devices, etc. These dimensions may be based upon data relating to drive currents/performance metrics, device dimensions, etc. Based upon such details of the devices, the integrated circuit design unit 2140 may determine specifications of the finFETs that are to be manufactured. Based upon these specifications, the integrated circuit design unit 2140 may provide data for manufacturing a semiconductor device package described herein.

The system 2100 may be capable of performing analysis and manufacturing of various products involving various technologies. For example, the system 2100 may design and production data for manufacturing devices of CMOS technology, Flash technology, BiCMOS technology, power devices, memory devices (e.g., DRAM devices), NAND memory devices, and/or various other semiconductor technologies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a set of fin structures, wherein each of the fin structures having a first height and comprising a fin, an oxide liner, and a nitride liner;
    performing a first partial nitride liner removal process and removing a first portion of the nitride liner above a second height, wherein said second height is below said first height;
    performing a partial oxide liner removal process and removing a first portion of said oxide liner above said second height to expose a first portion of the fin;
    performing a second partial nitride liner removal process and removing a second portion of said nitride liner between said second height and a third height in a gate portion of said set of fin structures, wherein said third height is below said second height;
    forming source/drain and forming a nitride spacer between said source/drain and said gate portion; and
    removing a second portion of said oxide liner exposed by removing said second portion of said nitride liner to expose a second portion of the fin, said first and second exposed portions of the fin being an effective fin height in said gate portion.

2. The method of claim 1, wherein forming said source/drain comprises exposing a third portion of the fins in a source/drain (S/D) portion of said set of fin structure, said third exposed portion being an effective fin height in said S/D portion, and wherein removing the second portion of said oxide liner to expose a second portion of the fin comprises removing said second portion of said oxide liner down proximate to said third height for increasing said effective fin height in the gate portion to at least substantially match the effective fin height of the fins in said S/D portion.

3. The method of claim 1, wherein forming said source/drain comprises exposing a third portion of the fins in a source/drain (S/D) portion of said set of fin structure, said third exposed portion being an effective fin height in said S/D portion, and wherein removing the second portion of said oxide liner to expose a second portion of the fin comprises removing said second portion of said oxide liner to increase the effective fin height in said gate portion relative to said effective fin height in said S/D portion.

4. The method of claim 3, wherein forming said source/drain further comprises performing an epitaxial (EPI) structure formation process in the S/D portion, wherein said EPI structure formation process results in an increase in said effective fin height in said S/D portion, and wherein the increase in the effective fin height in said gate portion reduces a difference between the effective fin height in the gate portion and the increased effective fin height in the S/D portion.

5. The method of claim 1, further comprising:
performing a gate oxide deposition process subsequent to performing said second partial nitride liner removal process, wherein said gate oxide deposition process comprises at least one of filling a plurality of divots formed from performing said second partial nitride liner removal process by performing an atomic layer deposition (ALD) process, or filling a plurality of divots formed from performing said second partial nitride liner removal process with a conformal silicon oxide material; and
removing, subsequent to performing said S/D formation, a portion of said gate oxide to expose said second portion of the fin for increasing said effective fin height in the gate portion.

6. The method of claim 5, wherein filling said divots with a conformal silicon oxide material comprises performing an in-situ radical assisted deposition (iRAD).

7. The method of claim 1, wherein:
performing said first partial nitride removal process comprises performing a first hot phosphorus liner removal process for removing said first portion of said nitride liner; and
performing said second partial nitride removal process comprises performing a second hot phosphorus liner removal process for removing said second portion of said nitride liner.

8. The method of claim 1, further comprising:
depositing a local isolation oxide material between said fins;
removing, subsequent to forming said S/D, a portion of said local isolation oxide to expose said second portion of the fin for increasing said effective fin height in said gate portion;
forming a protective gate layer in said gate portion prior to forming said source/drain; and
removing said protective gate layer in said gate region subsequent to forming said source/drain.

9. The method of claim 8, wherein:
performing said first partial nitride removal process comprises performing said first nitride removal process prior to performing said partial oxide liner removal process; and
performing said second partial nitride removal process comprises forming a plurality of divots adjacent to said second portion of said oxide liner; and
forming said protective gate layer comprises forming a dummy gate layer comprising an amorphous silicon (a-Si) material.

10. The method of claim 1, further comprising
performing a poly open CMP (POC) process in said gate region of said set of fins for creating a void region for forming a metal gate; and
performing a replacement metal gate (RMG) process for forming a metal gate in said void region.

11. A method, comprising:
forming a set of fins of a transistor;
forming an oxide liner over and between said set of fins;
forming a nitride liner over said oxide liner;
performing a first partial nitride removal process and removing a first portion of the nitride liner;
performing a partial oxide liner removal process and removing a first portion of the oxide liner to expose a first portion of the fins, wherein said first portion of the fin being a first effective fin height;
performing a second partial nitride liner removal process in a gate portion of said set of fins and removing a second portion of the nitride liner;
forming a source/drain and forming a nitride spacer between said source/drain and said gate portion; and
removing a second portion of said oxide liner to expose a second portion of the fin, said first and second exposed portions of the fin being a second effective fin height in said gate portion.

12. The method of claim 11, wherein forming said source/drain comprises exposing a third portion of the fins in a source/drain (S/D) portion of said set of fins, said third exposed portion being an effective fin height in said S/D portion, and removing said second portion of said oxide liner comprises removing said second portion of said oxide liner such that said second effective fin height is substantially equal to said effective fin height in the S/D portion.

13. The method of claim 11, wherein forming said source/drain comprises exposing a third portion of the fins in a source/drain (S/D) portion of said set of fins, said third exposed portion being an effective fin height in said S/D portion, and performing the second partial nitride liner removal process comprises forming a plurality of divots at a height as to reduce the difference between the second effective fin height and the effective fin height in the S/D portion by performing an etch back process for removing at least a portion of one or more materials from said divots.

14. The method of claim 13, further comprising determining a measurement of said effective fin height in the S/D portion, and removing said second portion of said oxide liner based on the measurement of the effective fin height in the S/D portion.

15. The method of claim 13, further comprising performing an epitaxial (EPI) structure formation process in the S/D portion, wherein said EPI structure formation process results in an increase in said effective fin height in said S/D portion, and wherein the amount of increase in said effective fin height in said S/D portion is substantially equal to difference between the second fin height and the first fin height.

16. A system, comprising:
a semiconductor device processing system to manufacture a semiconductor device comprising at least one fin field effect transistor (finFET), and
a processing controller operatively coupled to said semiconductor device processing system, said processing controller configured to control an operation of said semiconductor device processing system;
wherein said semiconductor device processing system is adapted to:
form a set of fin structures, wherein each of the fin structures having a first height and comprising a fin, an oxide liner, and a nitride liner,
perform a first partial nitride liner removal process and removing a first portion of the nitride liner above a second height, wherein said second height is below said first height;
perform a partial oxide liner removal process and removing a first portion of said oxide liner above said second height to expose a first portion of the fin;
perform a second partial nitride liner removal process and removing a second portion of said nitride liner between said second height and a third height in a gate portion of said set of fin structures, wherein said third height is below said second height;

form source/drain and forming a nitride spacer between said source/drain and said gate portion; and remove a second portion of said oxide liner exposed by removing said second portion of said nitride liner to expose a second portion of the fin, said first and second exposed portions of the fin being an effective fin height in said gate portion.

17. The system of claim 16, further comprising a design unit configured to generate a design comprising a definition for a plurality of processes and a definition for an operation of a FinFET device that comprises a plurality of fins, wherein data from said design unit is used by said process controller to control an operation of said semiconductor device processing system.

18. The system of claim 16, Wherein said semiconductor device processing system is further adapted to perform an epitaxial (EPI) deposition process in said source/drain, exposing a third portion of at least a portion of the fins in a source/drain (S/D) portion of the set of fins, said third exposed portion of the fins being an effective fin height in said S/D portion, and wherein removing the second portion of said oxide liner reduces the difference between the effective fin height in said gate portion and the effective fin height in said S/D portion.

19. The system of claim 16, further comprising:

performing a gate oxide deposition process subsequent to performing said second partial nitride liner removal process to form a gate oxide layer, Wherein a plurality of divots are formed as a result of performing said second nitride removal process; and removing a portion of said gate oxide layer subsequent to forming said source/drain to expose said second portion of the fin.

20. The system of claim 16, Wherein said semiconductor device processing system is further adapted to:

perform a poly open chemical-mechanical polishing (POC) in said gate region for creating a void region for forming a metal gate; and perform a replacement metal gate (RMG) process for depositing a high-k material for forming a metal gate.

* * * * *